United States Patent
Mori

(10) Patent No.: US 11,979,135 B2
(45) Date of Patent: May 7, 2024

(54) RESONATOR AND RESONANCE DEVICE

(71) Applicant: Murata Manufacturing Co., Ltd., Nagaokakyo (JP)

(72) Inventor: Atsushi Mori, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 618 days.

(21) Appl. No.: 17/188,372

(22) Filed: Mar. 1, 2021

(65) Prior Publication Data
US 2021/0184646 A1   Jun. 17, 2021

Related U.S. Application Data

(63) Continuation of application No. PCT/JP2019/027553, filed on Jul. 11, 2019.

(30) Foreign Application Priority Data

Oct. 5, 2018   (JP) .................................. 2018-190070

(51) Int. Cl.
    *H03H 9/02* (2006.01)
    *H03H 9/17* (2006.01)

(52) U.S. Cl.
    CPC .......... *H03H 9/02448* (2013.01); *H03H 9/17* (2013.01); *H03H 2009/02488* (2013.01)

(58) Field of Classification Search
    CPC .. H03H 9/02448; H03H 9/17; H03H 9/02393; H03H 9/0595; H03H 9/1057; H03H 9/2489; H03H 2009/02488
    See application file for complete search history.

(56) References Cited

U.S. PATENT DOCUMENTS

| | | | |
|---|---|---|---|
| 10,263,588 B2 * | 4/2019 | Kobayashi | H03H 3/04 |
| 10,749,496 B2 | 8/2020 | Yoshii et al. | |
| 2015/0188514 A1 * | 7/2015 | Yamada | H03H 9/0547 310/370 |
| 2019/0097600 A1 | 3/2019 | Yoshii et al. | |

FOREIGN PATENT DOCUMENTS

| | | |
|---|---|---|
| JP | 2012065293 A | 3/2012 |
| JP | 2017076911 A | 4/2017 |
| WO | 2017208568 A1 | 12/2017 |

OTHER PUBLICATIONS

Written Opinion of the International Search Authority issued for PCT/JP2019/027553, dated Aug. 27, 2019.
International Search Report issued for PCT/JP2019/027553, dated Aug. 27, 2019.

\* cited by examiner

*Primary Examiner* — Jeffrey M Shin
(74) *Attorney, Agent, or Firm* — Arentfox Shiff LLP

(57) ABSTRACT

A resonator is provided that includes a vibration part and a mass addition portion. The vibration part includes a piezoelectric film, an upper electrode, and a lower electrode. The upper electrode and the lower electrode are disposed on opposite sides with the piezoelectric film therebetween. The amount of displacement of the vibration part is greater in a region corresponding to at least part of the mass addition portion than in any other region. The mass addition portion has an inclined surface that slopes in such a manner that the mass addition portion has end regions and a central region thinner than at least one of the end regions when the vibration part is viewed in a plan view.

20 Claims, 14 Drawing Sheets

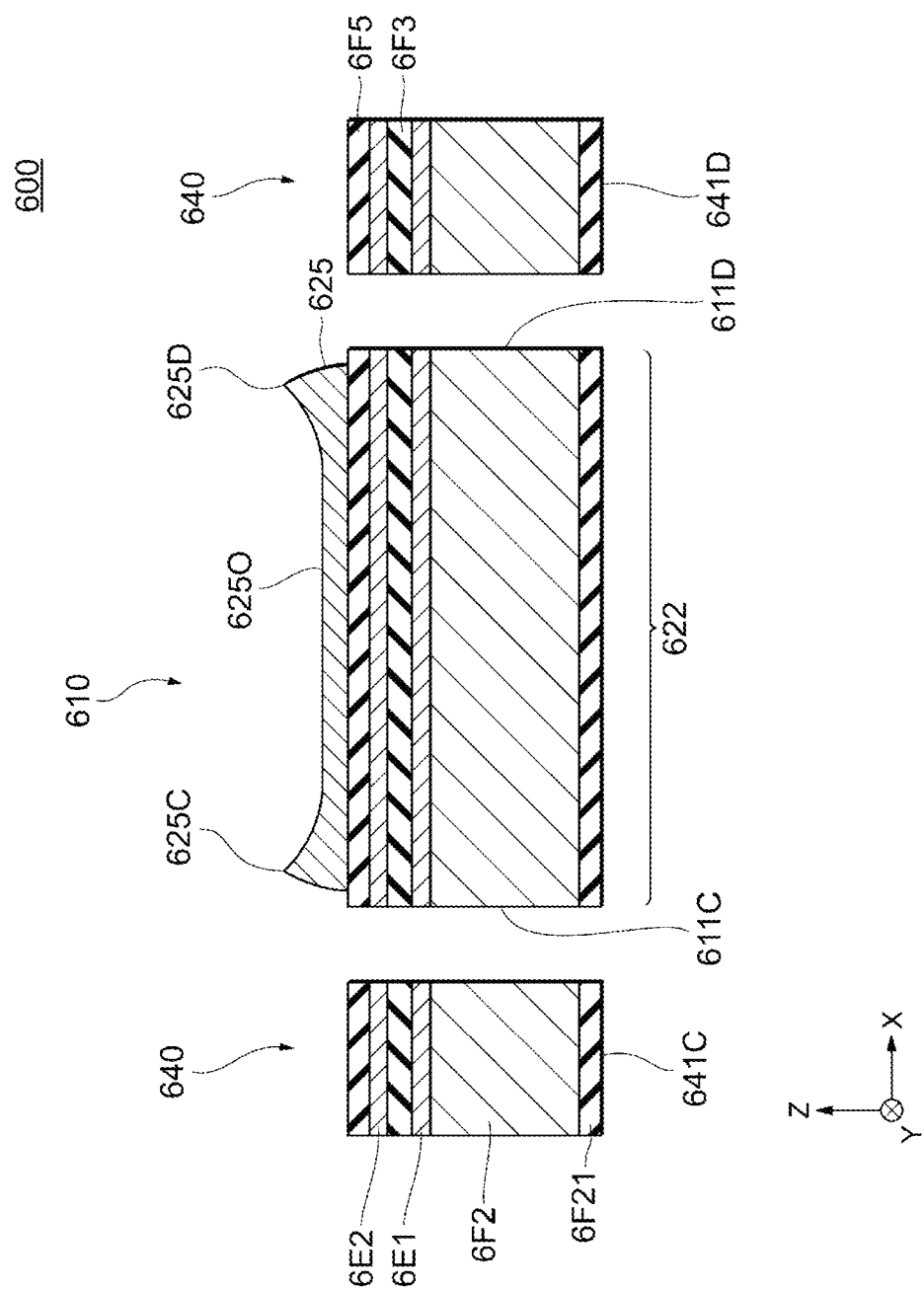

RESONATOR AND RESONANCE DEVICE

CROSS REFERENCE TO RELATED APPLICATIONS

The present application is a continuation of PCT/JP2019/027553 filed Jul. 11, 2019, which claims priority to JP Application No. 2018-190070, filed Oct. 5, 2018, the entire contents of each of which are incorporated herein by reference.

TECHNICAL FIELD

The present invention relates to a resonator and a resonance device including the resonator.

BACKGROUND

A resonance device, which is an example of micro-electro-mechanical systems (MEMS), is currently used as a timing device incorporated in electronic apparatuses, such as smartphones. The resonance device includes, for example, a lower cover, an upper cover, and a resonator placed in a cavity defined between the upper cover and the lower cover. The resonator includes, for example, a piezoelectric film, an upper electrode, a lower electrode, and an insulating film. The upper and lower electrodes are laid with the piezoelectric film therebetween. The insulating film is disposed between layers in the resonator or is on a surface of the resonator.

Japanese Unexamined Patent Application Publication No. 2012-65293 (hereinafter "Patent Document 1") discloses a specific configuration of such a resonator. The resonator concerned includes a base section, a vibration arm, a piezoelectric element, and a mass addition portion. The vibration arm extends from the base section in such a manner that the vibration arm can be bent and vibrate. The piezoelectric element is disposed on the vibration arm. The mass addition portion is closer than the piezoelectric element to a distal end of the vibration arm. The mass addition portion includes at least one mass addition film. Moreover, the at least one mass addition film and one of layers constituting the piezoelectric element are made of the same material. In addition, the piezoelectric element and the mass addition film may be formed all at once.

Such a conventional resonator typically includes a mass addition portion disposed in such a manner that the amount of displacement of a vibration part responsible for vibration is greater in a region corresponding to the mass addition portion than in any other region. The resonator is held in a vibration space defined within a resonance device. Upon application of, for example, drop impacts on the resonance device, the mass addition portion would come into contact with an inner wall of the resonance device and would, consequently, become damaged. Such a damaged mass addition portion could be a cause of fluctuations in the frequency of the resonator.

The mass addition portion has a surface in one shape or another, which is formed by removal of at least part of the surface in a process of adjusting the frequency. The shape of the surface of the mass addition portion can affect how effectively the mass addition portion will resist being damaged by accidental contact with the inner wall of the resonance device. In Patent Document 1, however, no particular mention is made on the shape of the surface of the mass addition portion.

SUMMARY OF THE INVENTION

The exemplary embodiments of the present invention have been made in view of such circumstances. It is an object of the present invention to provide a resonator conducive to improved reliability and a resonance device including the resonator.

A resonator according to an exemplary aspect of the present invention includes a vibration part and a mass addition portion. The vibration part includes a piezoelectric film, an upper electrode, and a lower electrode. The upper and lower electrodes are disposed on opposite sides with the piezoelectric film therebetween. The amount of displacement of the vibration part is greater in a region corresponding to at least part of the mass addition portion than in any other region. The mass addition portion has an inclined surface that slopes in such a manner that the mass addition portion has end regions and a central region thinner than at least one of the end regions when the vibration part is viewed in section.

The exemplary embodiments of the present invention provide a resonator conducive to improved reliability and a resonance device including the resonator.

BRIEF DESCRIPTION OF DRAWINGS

FIG. 14 is a sectional view of a mass addition portion according to the sixth embodiment, the sectional view being taken along a Z-X plane.

DETAILED DESCRIPTION OF EMBODIMENTS

Hereinafter, exemplary embodiments of the present invention will be described with reference to the accompanying drawings. In the accompanying drawings, the same or like reference signs denote the same or like constituent components. The accompanying drawings are provided merely as examples. The individual components are schematically illustrated in terms of their dimensions and shapes. The following embodiments should not be construed as limiting the technical scope of the present invention.

First Exemplary Embodiment

Figure 1:
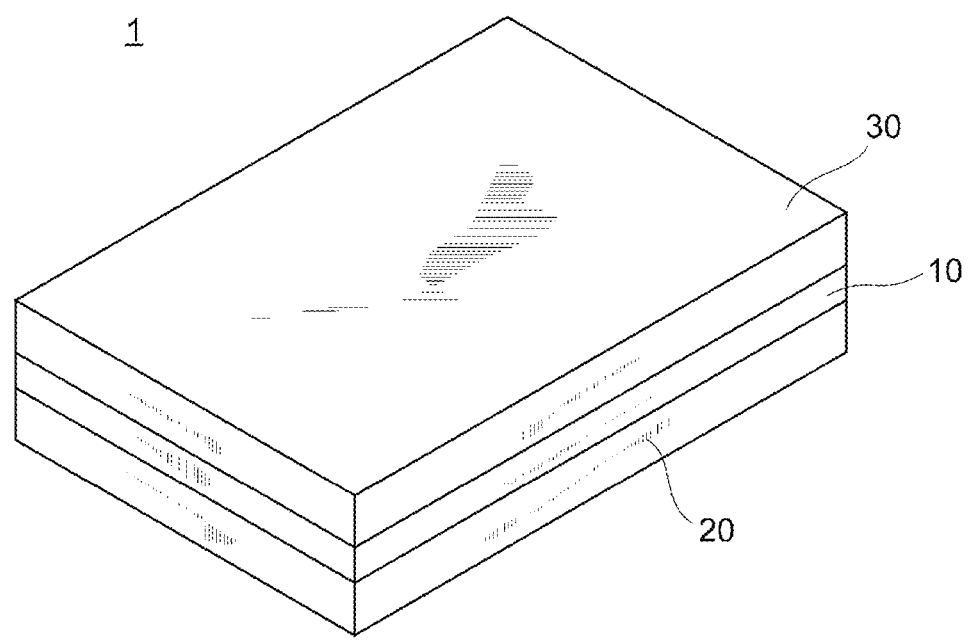
FIG. 1 is a schematic external perspective view of a resonance device according to a first exemplary embodiment.
Figure 1:
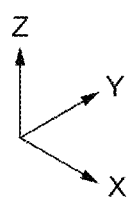
Figure 2:
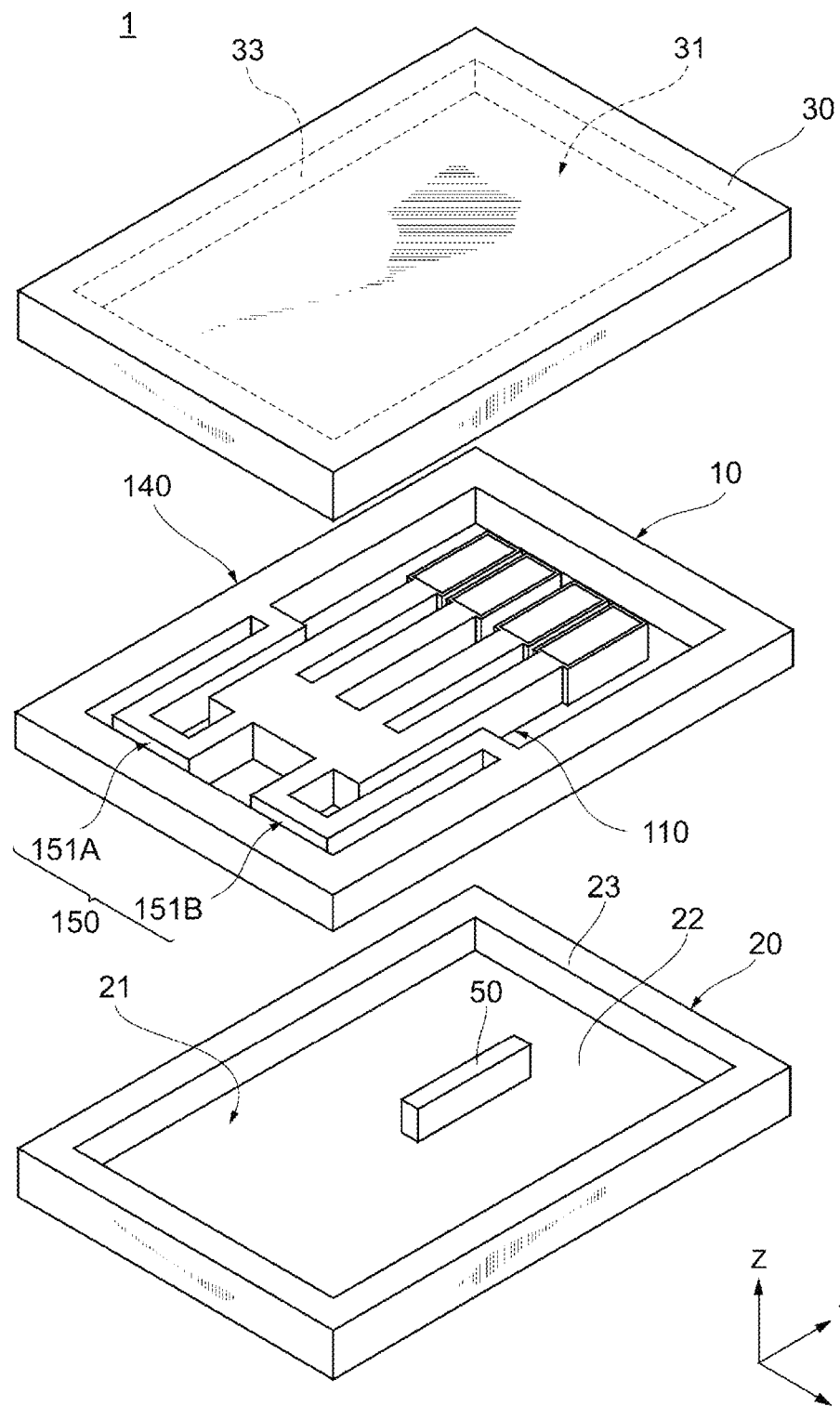
FIG. 2 is an exploded perspective view of the resonance device according to the first exemplary embodiment, schematically illustrating the structure of the resonance device.

The following describes the configuration of a resonance device 1 according to a first exemplary embodiment with reference to FIGS. 1 and 2. FIG. 1 is a schematic external perspective view of a resonance device according to a first embodiment. FIG. 2 is an exploded perspective view of the resonance device according to the first embodiment of the present invention, schematically illustrating the structure of the resonance device.

Resonance Device 1

As shown, the resonance device 1 includes a resonator 10, a lower cover 20, and an upper cover 30. The lower cover 20 and the upper cover 30 face each other with the resonator 10 therebetween. The lower cover 20, the resonator 10, and the upper cover 30 are stacked on top of each other in the stated order in the Z-axis direction. The resonator 10 and the lower cover 20 are joined to each other, and the resonator 10 and the upper cover 30 are joined to each other. A vibration space for the resonator 10 is defined between the lower cover 20 and the upper cover 30 joined to each other through the resonator 10. According to an exemplary aspect, the resonator 10, the lower cover 20, and the upper cover 30 are each made of a semiconductor substrate, a glass substrate, an organic substrate, or any other substrate that may be processed with a micromachining technology.

The following describes the individual components of the resonance device 1. The following description will be given assuming that the resonance device 1 is placed with the upper cover 30 on an upper side (i.e., on a top side) and the lower cover 20 on a lower side (i.e., on a back side).

In general, micro-electro-mechanical systems (MEMS) are used to produce the resonator 10, which is thus regarded as a MEMS resonator. The resonator 10 includes a vibration part 110, a holding part 140, and a holding arm 150. The vibration part 110 can simply be referred to as a vibrator and is held in the vibration space. The vibration part 110 may vibrate out of an X-Y plane, that is, in an out-of-plane bending-vibration mode. In some embodiments, the vibration part 110 may vibrate in the X-Y plane, that is, in an in-plane bending-vibration mode. The holding part 140 (which can generally be considered a frame) is in the form of, for example, a rectangular frame, in which the vibration part 110 is enclosed. The holding arm 150 forms a connection between the vibration part 110 and the holding part 140.

The lower cover 20 includes a bottom plate 22 and a side wall 23. The bottom plate 22 is in the form of a rectangular flat plate lying in an X-Y plane. The side wall 23 extends in the Z-axis direction from a peripheral edge portion of the bottom plate 22. The side wall 23 is joined to the holding part 140 of the resonator 10. The lower cover 20 has a recess 21 on its surface facing the vibration part 110 of the resonator 10. The recess 21 is defined by a top surface of the bottom plate 22 and an inner surface of the side wall 23. Moreover, the recess 21 is a cavity having a cuboid shape whose top is open. The vibration space for the resonator 10 is partially defined by the recess 21. The lower cover 20 includes, on its inner surface, a projection 50, which projects from the top surface of the bottom plate 22 into the vibration space.

According to an exemplary aspect, the structure of the upper cover 30 and the structure of the lower cover 20 except for the projection 50 are mirror images of each other with respect to the resonator 10 disposed therebetween. More specifically, the upper cover 30 includes a bottom plate 32 and a side wall 33. The bottom plate 32 is in the form of a rectangular flat plate lying in an X-Y plane. The side wall 33 extends in the Z-axis direction from a peripheral edge portion of the bottom plate 32. The side wall 33 is joined to the holding part 140 of the resonator 10. The upper cover 30 has a recess 31 on its surface facing the vibration part 110 of the resonator 10. The recess 31 is a cavity having a cuboid shape whose bottom is open. The vibration space for the resonator 10 is partially defined by the recess 31.

Alternatively and in some embodiments, the structure of the lower cover 20 and the structure of the upper cover 30 may not be mirror images of each other. For example, the lower cover 20 or the upper cover 30 may be dome-shaped. The recess 21 of the lower cover 20 and the recess 31 of the upper cover 30 may have different shapes. For example, the recess 21 and the recess 31 may be of different depths.

Resonator 10

Figure 3:
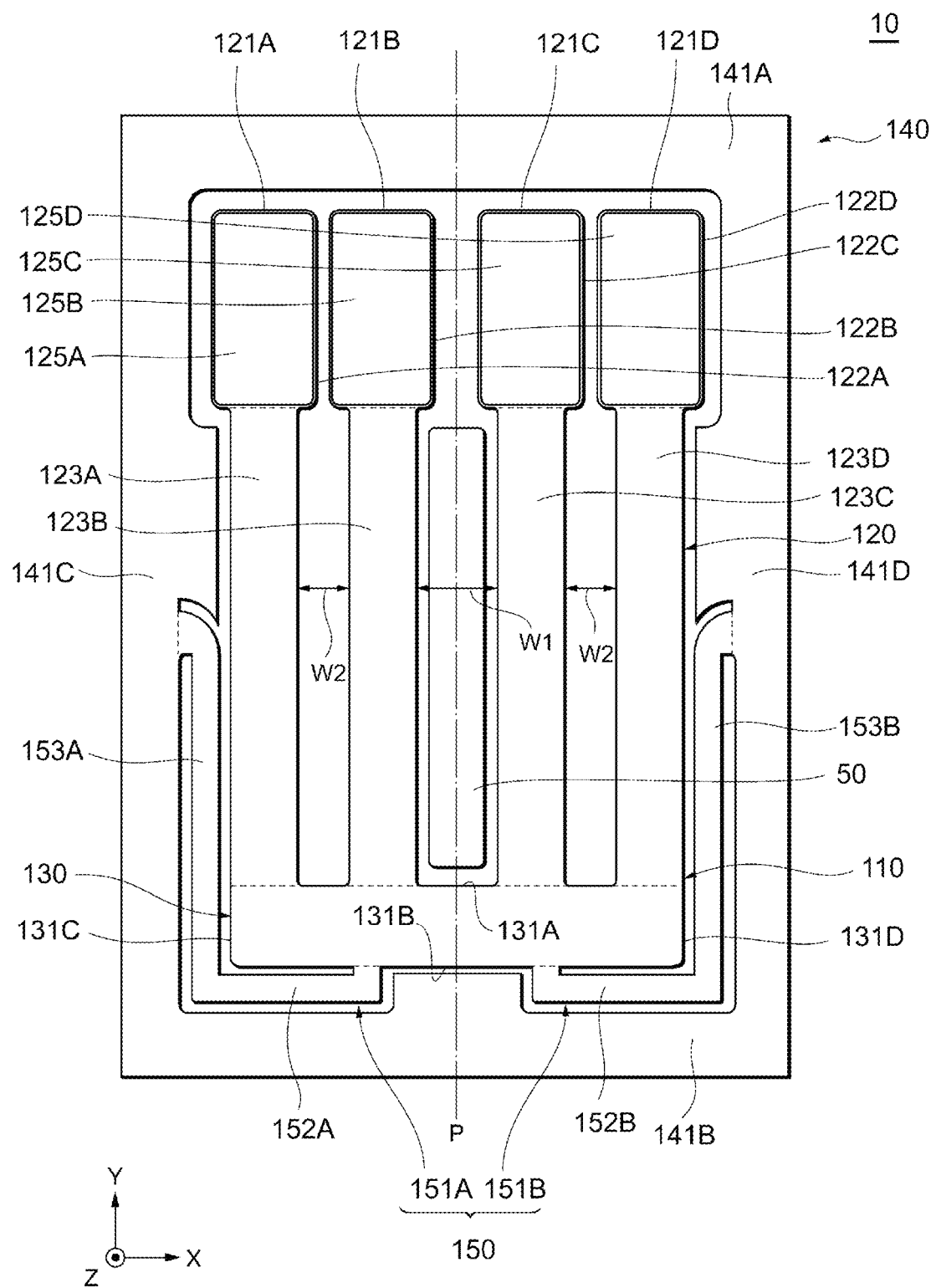
FIG. 3 is a plan view of a resonator according to the first exemplary embodiment, schematically illustrating the structure of the resonator.

The following describes, in more detail, the vibration part 110, the holding part 140, and the holding arm 150 of the resonator 10 according to an embodiment of the present invention with reference to FIG. 3. FIG. 3 is a plan view of a resonator according to the first embodiment of the present invention, schematically illustrating the structure of the resonator.

Vibration Part 110

The vibration part 110 is enclosed in the holding part 140 (i.e., a frame) when viewed in plan from the side on which the upper cover 30 is disposed. The vibration part 110 and the holding part 140 are arranged with a predetermined amount of clearance left therebetween. The vibration part 110 includes a vibration-generating section 120 and a base section 130 (or simply a base). The vibration-generating section 120 includes four vibration arms, which are denoted by 121A, 121B, 121C, and 121D, respectively. The base section 130 is connected to the vibration-generating section 120. It is not required that four vibration arms be included in the vibration-generating section 120. Instead, the vibration-generating section 120 may include one vibration arm or any other number of vibration arms. The vibration-generating section 120 and the base section 130 in the present embodiment are provided as one member.

Vibration Arms 121A to 121D

The vibration arms 121A, 121B, 121C, and 121D extend in the Y-axis direction and are arranged side by side in the stated order in the X-axis direction at predetermined spacings. The vibration arm 121A has a fixed end connected to a front end portion 131A (or simply front end) of the base section 130 and an open end located away from the front end portion 131A of the base section 130. The base section 130 will be described later. The vibration arm 121A includes a mass addition portion 122A (or mass additional portion) and an arm portion 123A, which are in line with each other in the direction in which the vibration arm 121A extends. The mass addition portion 122A is provided to the open end. The arm portion 123A extends from the fixed end and is connected to the mass addition portion 122A. This means that the amount of displacement of the vibration part 110 is greater in the region corresponding to the mass addition portion 122A than in any other region. Similarly, the vibration arms 121B, 121C, and 121D include their respective mass addition portions, which are denoted by 122B, 122C, and 122D, and also include their respective arm portions, which are denoted by 123B, 123C, and 123D. The arm portions 123A to 123D each have a width of about 50 μm in the X-axis direction and a length of about 450 μm in the Y-axis direction.

Two of the four vibration arms, or more specifically, the vibration arms 121A and 121D are considered to be outer vibration arms on the outer side in the X-axis direction. The other two, or more specifically, the vibration arms 121B and 121C are considered to be inner vibration arms on the inner side in the X-axis direction. The width of a clearance between the arm portion 123B of the inner vibration arm 121B and the arm portion 123C of the inner vibration arm 121C is referred to as a release width W1. The width of a clearance between the arm portion 123A of the outer vibration arm 121A and the arm portion 123B of the inner vibration arm 121B is referred to as a release width W2, with the outer vibration arm 121A and the inner vibration arm 121B being adjacent to each other in the X-axis direction. The width of a clearance between the arm portion 123D of the outer vibration arm 121D and the arm portion 123C of the inner vibration arm 121C is also referred to as the release width W2, with the outer vibration arm 121D and the inner vibration arm 121C being adjacent to each other in the X-axis direction. The release width W1 is greater than the release width W2. In one exemplary aspect, the device is configured such that the release width W1 is greater than the release width W2 and offers improved vibration characteristics and improved durability. The release widths W1 and W2 are not limited to particular values. For example, the release width W1 may be about m, and the release width W2 may be about 10 μm in exemplary aspects. FIG. 3 is a nonrestrictive example. That is, the release width W1 between the arm portions of the inner vibration arms may be smaller than or equal to the release width W2 between each of the inner vibration arms and the corresponding outer vibration arm.

The mass addition portions 122A to 122D include, on their surfaces, their respective mass addition films, which are denoted by 125A to 125D. Specifically, each of the mass addition films 125A to 125D geometrically conforms to the corresponding one of the mass addition portions 122A to 122D when viewed in plan from the side on which the upper cover 30 is disposed. With the addition of the mass addition films 125A to 125D, the weight per unit length (hereinafter also simply referred to as weight) of each of the mass addition portions 122A to 122D is greater than the weight of the corresponding one of the arm portions 123A to 123D. The vibration part 110 may thus be small in size and have improved vibration characteristics. In addition to providing the additional weight to tip portions (or simply tips) of the vibration arms 121A to 121D, the mass addition films 125A to 125D enable adjustment of the resonant frequencies of the vibration arms 121A to 121D, or more specifically, the mass addition films 125A to 125D may each be partially removed for use as frequency adjustment films.

In the present embodiment, the width of each of the mass addition portions 122A to 122D in the X-axis direction is greater than the width of the corresponding one of the arm portions 123A to 123D in the X-axis direction. The mass addition portions 122A to 122D having greater width have correspondingly greater weight. Although it is required that the weight per unit length of each of the mass addition portions 122A to 122D be greater than the weight per unit length of the corresponding one of the arm portions 123A to 123D, the width of each of the mass addition portions 122A to 122D in the X-axis direction is not necessarily as described above. The width of each of the mass addition portions 122A to 122D in the X-axis direction may be equal to or smaller than the width of the corresponding one of the arm portions 123A to 123D in the X-axis direction.

When viewed in plan from the side on which the upper cover 30 is disposed, the mass addition portions 122A to 122D each have a substantially rectangular shape with four rounded corners (e.g., radius corners). The arm portions 123A to 123D are substantially rectangular, with radius corners being formed at the fixed ends connected to the base section 130 and at junctions connected to the mass addition portions 122A to 122D. The shape of each of the mass addition portions 122A to 122D and the shape of the arm portions 123A to 123D are not necessarily as described above. For example, the mass addition portions 122A to 122D may each be trapezoidal or L-shaped in alternative aspects. Moreover, the arm portions 123A to 123D may each be trapezoidal or may each have, for example, a slit.

When viewed in plan from the side on which the upper cover 30 is disposed, the arm portion 123B of the inner vibration arm 121B and the arm portion 123C of the inner vibration arm 121C are arranged side by side with the projection 50 therebetween, with the projection 50 projecting from the lower cover 20. The projection 50 extends along the arm portions 123B and 123C in the Y-axis direction. According to an exemplary aspect, the projection 50 is about 240 μm long in the Y-axis direction and is about 15 μm long in the X-axis direction. The projection 50 makes the lower cover 20 less prone to warpage.

Base Section 130

Referring to FIG. 3, the base section 130 viewed in plan from the side on which the upper cover 30 is disposed includes the front end portion 131A (i.e., a front end), a rear end portion 131B (i.e., a rear end), a left end portion 131C (i.e., a left end or left side), and a right end portion 131D (i.e., right end or right side). The front end portion 131A, the rear end portion 131B, the left end portion 131C, and the right end portion 131D are each part of a peripheral region of the base section 130. Specifically, the front end portion 131A adjoins the vibrations arms 121A to 121D and extends in the X-axis direction. The rear end portion 131B is on the side opposite the vibration arms 121A to 121D and extends in the X-axis direction. The left end portion 131C is in line with the vibration arm 121A in a distance from the vibration arm 121D and extends in the Y-axis direction. The right end portion 131D is in line with the vibration arm 121D in a distance from the vibration arm 121A and extends in the Y-axial direction.

The left end portion 131C has an end linked to one end of the front end portion 131A and another end linked to one end of the rear end portion 131B. The right end portion 131D has an end linked to the other end of the front end portion 131A and another end linked to the rear end portion 131B. The front end portion 131A and the rear end portion 131B are on opposite sides in the Y-axis direction. The left end portion 131C and the right end portion 131D are on opposite sides in the X-axis direction. The front end portion 131A is connected with the vibration arms 121A to 121D.

When viewed in plan from the side on which the upper cover 30 is disposed, the base section 130 has a substantially rectangular shape whose long sides, respectively, are the front end portion 131A and the rear end portion 131B and whose short sides, respectively, are the left end portion 131C and the right end portion 131D. As shown, the base section 130 is substantially symmetric with respect to an imaginary plane P, which lies along perpendicular bisectors that respectively bisect the front end portion 131A and the rear end portion 131B. It is noted that the base section 130 is not necessarily rectangular as illustrated in FIG. 3 and may have any other shape that is substantially symmetric with respect to the imaginary plane P. For example, the base section 130 may have a trapezoidal shape two sides of which, respectively, are the front end portion 131A and the rear end portion 131B, with either of these portions being longer than the other. At least one of the front end portion 131A, the rear end portion 131B, the left end portion 131C, and the right end portion 131D may be bent or curved.

The imaginary plane P is a plane of symmetry of the entirety of the vibration part 110. The imaginary plane P may thus be regarded as a plane passing through the center of the vibration arms 121A to 121D in the X-axis direction and is located between the inner vibration arms 121B and 121C. Specifically, each of the outer vibration arm 121A and the inner vibration arm 121B, which are adjacent to each other, and the corresponding one of the outer vibration arm 121D and the inner vibration arm 121C, which are adjacent to each other, are arranged symmetrically about the imaginary plane P.

According to an exemplary aspect, the maximum distance between the front end portion 131A and the rear end portion 131B of the base section 130 in the Y-axis direction is herein referred to as a base section length and is, for example, about 40 μm. Moreover, the maximum distance between the left end portion 131C and the right end portion 131D of the base section 130 in the X-axis direction is herein referred to as a base section width and is, for example, about 300 μm. Referring to FIG. 3, which illustrates a configuration example, the base section length is the length of the left end portion 131C or the right end portion 131D, and the base section width is the length of the front end portion 131A or the rear end portion 131B.

Holding Part 140

The holding part 140 (or frame) is provided such that the vibration part 110 is held in the vibration space defined by the lower cover 20 and the upper cover 30. The vibration part 110 may, for example, be enclosed in the holding part 140. Referring to FIG. 3, the holding part 140 viewed in plan from the side on which the upper cover 30 is disposed includes a front frame 141A, a rear frame 141B, a left frame 141C, and a right frame 141D. The front frame 141A, the rear frame 141B, the left frame 141C, and the right frame 141D are each part of a substantially rectangular frame body in which the vibration part 110 is enclosed. Specifically, the front frame 141A is located beyond the vibration-generating section 120 when viewed from the base section 130 and extends in the X-axis direction. The rear frame 141B is located beyond the base section 130 when viewed from the vibration-generating section 120 and extends in the X-axis direction. The left frame 141C is located beyond the vibration arm 121A when viewed from the vibration arm 121D and extends in the Y-axis direction. The right frame 141D is located beyond the vibration arm 121D when viewed from the vibration arm 121A and extends in the Y-axis direction. Moreover, the holding part 140 is also symmetrically disposed about the imaginary plane P.

The left frame 141C has an end connected to one end of the front frame 141A and has another end connected to one end of the rear frame 141B. The right frame 141D has an end connected to the other end of the front frame 141A and another end connected to the other end of the rear frame 141B. The front frame 141A and the rear frame 141B are on opposite sides in the Y-axis direction with the vibration part 110 therebetween. The left frame 141C and the right frame 141D are on opposite sides in the X-axis direction with the vibration part 110 therebetween. The holding part 140 is not necessarily in the form of a frame extending continuously in the circumferential direction. It is required that the holding part 140 extend along at least part of the periphery of the vibration part 110.

Holding Arm 150

The holding arm 150 is disposed on the inner side with respect to the holding part 140 and forms a connection between the base section 130 and the holding part 140. Referring to FIG. 3, the holding arm 150 viewed in plan from the side on which the upper cover 30 is disposed includes a left holding arm 151A and a right holding arm 151B. The left holding arm 151A forms a connection between the rear end portion 131B of the base section 130 and the left frame 141C of the holding part 140. The right holding arm 151B forms a connection between the rear end portion 131B of the base section 130 and the right frame 141D of the holding part 140. The left holding arm 151A includes a holding rear arm 152A and a holding side arm 153A, and the right holding arm 151B includes a holding rear arm 152B and a holding sidearm 153B. The holding arm 150 is symmetric with respect to the imaginary plane P.

The holding rear arms 152A and 152B extend from the rear end portion 131B of the base section 130 (opposite the vibration arms) and lie between and the rear end portion 131B of the base section 130 and the holding part 140. Specifically, the holding rear arm 152A extends toward the rear frame 141B from the rear end portion 131B of the base section 130 and is bent to extend toward the left frame 141C. The holding rear arm 152B extends toward the rear frame 141B from the rear end portion 131B of the base section 130 and is bent to extend toward the right frame 141D.

The holding side arm 153A extends along the outer vibration arm 121A and lies between the outer vibration arm 121A and the holding part 140. The holding side arm 153B extends along the outer vibration arm 121D and lies between the outer vibration arm 121D and the holding part 140. Specifically, the holding sidearm 153A extends toward the front frame 141A from an end portion of the holding rear arm 152A adjacent to the left frame 141C and is bent to be connected to the left frame 141C. The holding side arm 153B extends toward the front frame 141A from an end portion of the holding rear arm 152B adjacent to the right frame 141D and is bent to be connected to the right frame 141D.

According to alternative aspects, the holding arm 150 is not necessarily configured as described above. For example, the holding arm 150 may be connected to the left end portion 131C and the right end portion 131D of the base section 130. The holding arm 150 may be connected to the front frame 141A of the holding part 140.

Multilayer Structure

Figure 4:
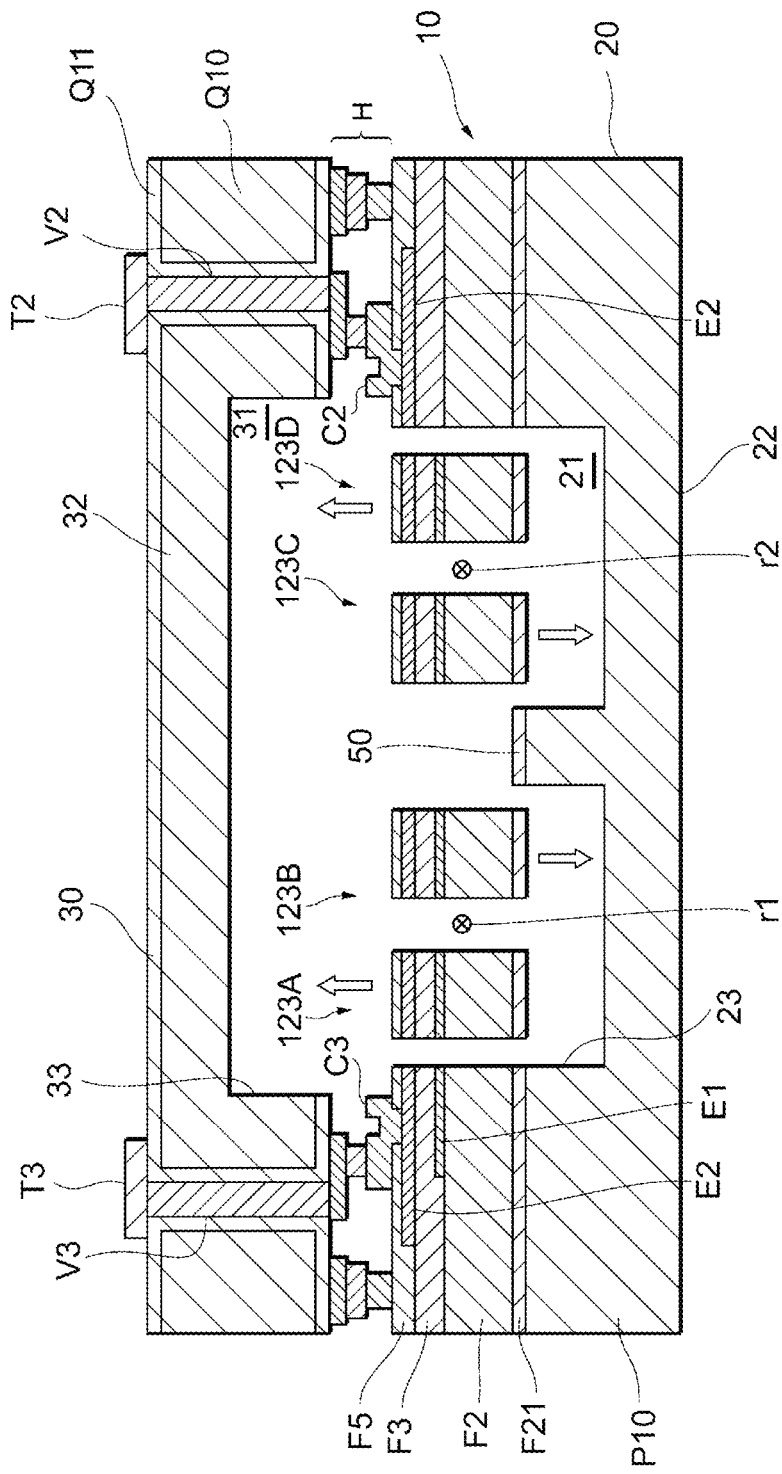
FIG. 4 is a sectional view of the resonance device taken along a line extending in the X-axis direction, schematically illustrating the multilayer structure of the resonance device in FIG. 1.
Figure 5:
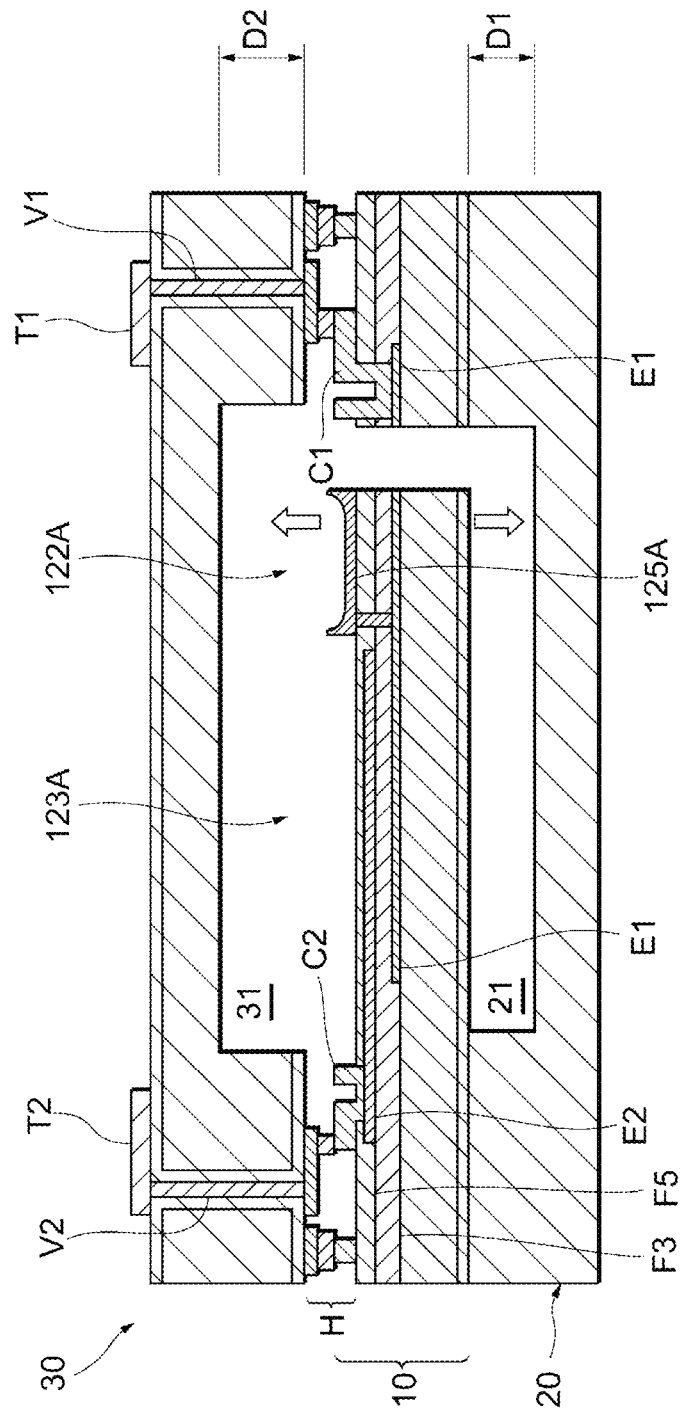
FIG. 5 is a sectional view of the resonance device taken along a line extending in the Y-axis direction, schematically illustrating the multilayer structure of the resonance device in FIG. 1.

The following describes the multilayer structure and actions of the resonance device 1 according to the first embodiment with reference to FIGS. 4 and 5. FIG. 4 is a sectional view of the resonance device taken along a line extending in the X-axis direction, schematically illustrating the multilayer structure of the resonance device in FIG. 1. FIG. 5 is a sectional view of the resonance device taken along a line extending in the Y-axis direction, schematically illustrating the multilayer structure of the resonance device in FIG. 1. For purposes of the exemplary multilayer structure of the resonance device 1, FIG. 4 schematically illustrates, for example, the arm portions 123A to 123D, an extended line C2, an extended line C3, a through-via electrode V2, and a through-via electrode V3 that are viewed in section; however, this does not necessarily mean that their cross sections are on the same plane. For example, the through-via electrodes V2 and V3 may be parallel to a Z-X plane defined by the Z-axis and the X-axis and may be located away, in the Y-axis direction, from the cross sections of the arm portions 123A to 123D. The same holds for FIG. 5. That is, to describe the exemplary multilayer structure of the resonance device 1, FIG. 5 schematically illustrates the mass addition portion 122A, the arm portion 123A, an extended line C1, the extended line C2, a through-via electrode V1, and the through-via electrode V2 that are viewed in section; however, this does not necessarily mean that their cross sections are on the same plane.

The holding part 140 of the resonator 10 of the resonance device 1 is disposed on and joined to the side wall 23 of the lower cover 20. The holding part 140 of the resonator 10 is also joined to the side wall 33 of the upper cover 30. The resonator 10 is held between the lower cover 20 and the upper cover 30. The lower cover 20, the upper cover 30, and the holding part 140 of the resonator 10 define the vibration space in which the vibration part 110 vibrates. The resonator 10, the lower cover 20, and the upper cover 30 are each formed by using, for example, a silicon substrate (hereinafter referred to as an Si substrate). In some embodiments, the resonator 10, the lower cover 20, and the upper cover 30 may each be formed by using a silicon-on-insulator (SOI) substrate, which is a silicon layer with a silicon oxide film laid thereon.

Resonator 10

The vibration part 110, the holding part 140, and the holding arm 150 of the resonator 10 are integrally formed in the same process. The resonator 10 includes an Si substrate F2 and a metal film E1. The Si substrate F2 is an example of the substrate, and the metal film E1 is stacked on top of the Si substrate F2. The metal film E1 is overlaid with a piezoelectric film F3, and a metal film E2 is stacked on top of the piezoelectric film F3. The metal film E2 is overlaid with a protective film F5. Each of the mass addition portions 122A to 122D includes the corresponding one of the mass addition films 125A to 125D on the protective film F5. The vibration part 110, the holding part 140, and the holding arm 150 each have a geometry obtained by patterning the multilayer body including mainly the Si substrate F2, the metal film E1, the piezoelectric film F3, the metal film E2, and the protective film F5. The multilayer body may be patterned by dry etching in which the multilayer body is exposed to argon (Ar) ion beams for removal processing.

The Si substrate F2 is, for example, a degenerate n-type silicon (Si) semiconductor having a thickness of about 6 µm and doped with n-type dopants such as phosphorus (P), arsenic (As), and antimony (Sb). The resistance value of degenerate silicon (Si) for use as the Si substrate F2 may, for example, be less than 16 mΩ·cm and is more preferably not more than 1.2 mΩ·cm. On a lower surface of the Si substrate F2 is a temperature characteristics correction layer F21, which is formed from silicon oxide such as $SiO_2$.

The temperature characteristics correction layer F21 enables, at least at or near room temperatures, a reduction in the temperature coefficient of the resonant frequency of the resonator 10, that is, a reduction in the rate of change in resonant frequency per unit temperature. The temperature characteristics correction layer F21 included in the vibration part 110 enables the resonator 10 to exhibit improved temperature characteristics. The vibration part 110 may include a temperature characteristics correction layer provided on an upper surface of the Si substrate F2 or may include temperature characteristics correction layers respectively provided on the upper and lower surfaces of the Si substrate F2.

The temperature characteristics correction layer F21 on the mass addition portions 122A to 122D desirably has a uniform thickness. For purposes of this disclosure, the uniform thickness means that variations within a range of ±20% from the thickness mean value of the temperature characteristics correction layer F21 are tolerated.

The metal films E1 and E2 each include a vibration-generating electrode and an extended electrode. The vibration-generating electrode causes the vibration arms 121A to 121D to vibrate. The extended electrode electrically connects the vibration-generating electrode to an external power source. In the arm portions 123A to 123D of the vibration arms 121A to 121D, regions being part of the metal film E1 and functioning as the vibration-generating electrode are opposite to regions being part of the metal film E2 and functioning as the vibration-generating electrode, with the piezoelectric film F3 being located between the metal films E1 and E2. Regions functioning as the extended electrodes of the metal films E1 and E2 may, for example, extend out from the base section 130 to the holding part 140 through the holding arm 150. The metal film E1 is electrically continuous throughout the resonator 10. The regions of the metal film E2 that are included in the outer vibration arms 121A and 121D are electrically isolated from the regions of the metal film E2 that are included in the inner vibration arms 121B and 121C. The metal film E1 is a lower electrode, and the metal film E2 is an upper electrode.

The thickness of each of the metal films E1 and E2 is, for example, not less than about 0.1 µm and not more than about 0.2 µm. After being formed, the metal films E1 and E2 undergo removal processing (e.g., etching) and are patterned into mainly the vibration-generating electrodes and the extended electrodes. The metal films E1 and E2 are formed from, for example, metallic materials whose crystal structure is a body-centered cubic structure. Specifically, the metal films E1 and E2 are each formed from, for example, molybdenum (Mo) or tungsten (W). When the Si substrate F2 is a regenerate semiconductor substrate having a high electrical conductivity, the metal film E1 may be eliminated, and the Si substrate F2 may double as a lower electrode.

The piezoelectric film F3 is a thin film formed from a piezoelectric material for converting between electrical energy and mechanical energy. The piezoelectric film F3 expands and contracts in the Y-axis direction in an X-Y plane in accordance with the electric field generated in the piezoelectric film F3 by the metal films E1 and E2. Through the expansion and contraction of the piezoelectric film F3, the open ends of the vibration arms 121A to 121D undergo displacement toward the bottom plate 22 of the lower cover 20 and displacement toward the bottom plate 32 of the upper cover 30. This means that the resonator 10 vibrates in the out-of-plane bending-vibration mode.

The piezoelectric film F3 is formed from a material having a wurtzite hexagonal crystal structure. For example, the piezoelectric film F3 includes, as a principal component, a nitride or an oxide, and more specifically, aluminum nitride (AN), scandium aluminum nitride (ScAlN), zinc oxide (ZnO), gallium nitride (GaN), or indium nitride (InN). Scandium aluminum nitride is obtained by substituting part of aluminum in aluminum nitride with scandium. Instead of being substituted with scandium, part of aluminum in aluminum nitride may be substituted with magnesium (Mg) and niobium (Nb), with magnesium (Mg) and zirconium (Zr), or with any other two elements. The piezoelectric film F3 has a thickness of about 1 μm. In some embodiments, the thickness of the piezoelectric film F3 may be in the range of about 0.2 μm to about 2 μm.

The protective film F5 is provided to protect the metal film E2 from oxidation. Although it is preferred that the protective film F5 be on the side on which the upper cover 30 is disposed, the protective film F5 does not necessarily lie open to the bottom plate 32 of the upper cover 30. The protective film F5 may be overlaid with, for example, a parasitic capacitance reduction film that reduces the capacitance of wiring of the resonator 10. The protective film F5 is a nitride film formed from aluminum nitride (AlN) or silicon nitride ($SiN_X$) or is an oxide film formed from aluminum oxide ($Al_2O_3$), tantalum pentoxide ($Ta_2O_5$), or silicon nitride ($SiO_X$).

Each of the mass addition films 125A to 125D is a surface of the corresponding one of the mass addition portions 122A to 122D and faces the upper cover 30. Each of the mass addition films 125A to 125D is a frequency adjustment film for the corresponding one of the vibration arms 121A to 121D. The mass addition films 125A to 125D are partially removed through trimming processing for adjustment of the frequency of the resonator 10. With a view to enhancing the efficiency of frequency adjustment, it is desired that the mass addition films 125A to 125D be formed from a material whose mass reduction rate at the time of etching is faster than the mass reduction rate of the protective film F5. The mass reduction rate is obtained by multiplying the etching rate by the density. The etching rate refers to the thickness removed per unit time. Although it is required that the relationship between the mass reduction rate of the protective film F5 and the mass reduction rate of the mass addition films 125A to 125D be as noted above, the magnitude relationship between the etching rate of the protective film F5 and the etching rate of the mass addition films 125A to 125D may be adjusted as desired. With a view to increasing the weight of the mass addition portions 122A to 122D efficiently, it is preferred that the mass addition films 125A to 125D be formed from a material of high specific gravity. For these reasons, the mass additions films 125A to 125D are formed from a metallic material such as molybdenum (Mo), tungsten (W), gold (Au), platinum (Pt), nickel (Ni), or titanium (Ti). The protective film F5 may be partially removed through trimming processing. In this case, the protective film F5 is also regarded as a frequency adjustment film.

During manufacture, the process of adjusting the frequency involves trimming processing in which upper surfaces of the mass addition films 125A to 125D are partially removed. The shape of the mass addition films 125A to 125D will be specifically described later. As the trimming processing, dry etching involving radiation of argon (Ar) ion beams may be applied to the mass addition films 125A to 125D. A wide area may be radiated with ion beams, which thus provide a high degree of processing efficiency. Meanwhile, the mass addition films 125A to 125D would be electrically charged by ion beams bearing electrical charges. The vibration orbit of the vibration arms 121A to 121D would be changed due to the coulomb interaction in the electrically charged mass addition films 125A to 125D, and the vibration characteristics of the resonator 10 would degrade accordingly. According to an exemplary aspect, to avoid such a defective condition, the mass addition films 125A to 125D are desirably grounded.

Referring to FIG. 5, which illustrates a configuration example, the mass addition film 125A is electrically connected to the metal film E1 through a through-via electrode extending through both the piezoelectric film F3 and the protective film F5. Similarly, the mass addition films 125B to 125D (not illustrated) are electrically connected to the metal film E1 through through-via electrodes. The mass addition films 125A to 125D are not necessarily grounded as noted above, and may, for example, electrically connected to the metal film E1 through side electrodes extending along side surfaces of the mass addition portions 122A to 122D. Instead of being electrically connected to the metal film E1, the mass addition films 125A to 125D may, for example, be electrically connected the metal film E2 in a manner so as to reduce the possibility of becoming charged.

The extended lines C1, C2, and C3 are provided on the protective film F5 on the holding part 140. The extended line C1 is electrically connected to the metal film E1 through a through-hole extending through both the piezoelectric film F3 and the protective film F5. The extended line C2 is electrically connected, through a through-hole in the protective film F5, to portions of the metal film E2 that are included in the outer vibration arms 121A and 121D. The extended line C3 is electrically connected, through a through-hole in the protective film F5, to portions of the metal film E2 that are included in the inner vibration arms 121B and 121C. In an exemplary aspect, the extended lines C1 to C3 are each formed from a metallic material such as aluminum (Al), germanium (Ge), gold (Au), or tin (Sn).

Lower Cover 20

The bottom plate 22 and the side wall 23 of the lower cover 20 are integrally formed of an Si substrate P10. The Si substrate P10 is formed from nondegenerate silicon and has a resistivity of, for example, 10 Ω·cm or more. The Si substrate P10 lies open to the inside of the recess 21 of the lower cover 20. The projection 50 has an upper surface covered with the temperature characteristics correction layer F21. With a view to inhibiting electrification of the projection 50, the Si substrate P10, whose electrical resistivity is lower than the electrical resistivity of the temperature characteristics correction layer F21, may be exposed at the upper surface of the projection 50, or an electrically conductive layer may be provided on the upper surface of the projection 50.

The thickness of the lower cover 20 in the Z-axis direction is about 150 μm, for example. The depth of the recess 21 in the Z-axis direction is denoted by D1 and is about 100 μm, for example. It should be appreciated that the amplitude of the vibration arms 121A to 121D is limited by the depth D1. That is, their maximum amplitude on the inner side of the lower cover 20 is about 100 μm.

The lower cover 20 may be regarded as part of the SOI substrate. With the resonator 10 and the lower cover 20 being regarded as a MEMS substrate integrally formed of the SOI substrate, the Si substrate P10 of the lower cover 20 is a support substrate of the SOI substrate, the temperature characteristics correction layer F21 of the resonator 10 is a buried oxide (BOX) layer, and the Si substrate F2 of the resonator 10 is an active layer of the SOI substrate. Part of the continuous MEMS substrate may be used to form various types of semiconductor elements and circuits on the outer portion of the resonance device 1.

Upper Cover 30

The bottom plate 32 and the side wall 33 of the upper cover 30 are integrally formed of an Si substrate Q10. It is preferred that atop surface and aback surface of the upper cover 30 and inner surfaces of the through-holes be covered with a silicon oxide film Q11. The silicon oxide film Q11 is formed on atop surface of the Si substrate Q10 by, for example, oxidation of the Si substrate Q10 or chemical vapor deposition (CVD). The Si substrate Q10 lies open to the inside of the recess 31 of the upper cover 30. A getter layer may be provided on a surface of the recess 31 of the upper cover 30 in a manner so as to face the resonator 10. The getter layer is formed from, for example, titanium (Ti). The getter layer adsorbs gas removed from a joint part H. The decrease in the degree of vacuum in the vibration space may be minimized accordingly. Alternatively, the getter layer may be provided on a surface of the recess 21 of the lower cover 20 in a manner so as to face the resonator 10. In some embodiments, two getter layers may respectively be formed on the surface of the recess 21 of the lower cover 20 and the surface of the recess 31 of the upper cover 30 in a manner so as to face the resonator 10.

The thickness of the upper cover 30 in the Z-axis direction is about 150 µm, for example. The depth of the recess 31 in the Z-axis direction is denoted by D2 and is about 100 µm, for example. The amplitude of the vibration arms 121A to 121D is limited by the depth D2; that is, their maximum amplitude on the inner side of the upper cover 30 is about 100 µm.

As further shown in the exemplary aspect, terminals are provided on the upper surface of the upper cover 30 (i.e., the surface opposite the surface facing the resonator 10) and are denoted by T1, T2, and T3, respectively. The terminal T1 is a mounting terminal that forms a connection between the metal film E1 and the ground. The terminal T2 is a mounting terminal that forms an electrical connection between the external power source and the regions of the metal film E2 that are included in the outer vibration arms 121A and 121D. The terminal T3 is amounting terminal that forms an electrical connection between the external power source and regions of the metal film E2 that are included in the inner vibration arms 121B and 121C. The terminals T1 to T3 are formed of a metallized (base) layer of, for example, chromium (Cr), tungsten (W), or nickel (Ni) and are plated with, for example, nickel (Ni), gold (Au), silver (Ag), or copper (Cu). With a view to achieving balanced parasitic capacitance and balanced mechanical strength, a dummy terminal electrically isolated from the resonator 10 may be provided on the top surface of the upper cover 30.

The through-via electrodes V1, V2, and V3 are provided in the side wall 33 of the upper cover 30. The through-via electrode V1 forms an electrical connection between the terminal T1 and the extended line C1. The through-via electrode V2 forms an electrical connection between the terminal T2 and the extended line C2. The through-via electrode V3 forms an electrical connection between the terminal T3 and the extended line C3. The through-via electrodes V1 to V3 are through-holes extending in the Z-axis direction through the side wall 33 of the upper cover 30 and filled with an electrically conductive material. The electrically conductive material is, for example, polycrystalline silicon (Poly-Si), copper (Cu), or gold (Au).

The joint part H is provided between the side wall 33 of the upper cover 30 and the holding part 140 such that the side wall 33 of the upper cover 30 is joined to the holding part 140 of the resonator 10. The joint part H is in the form of a closed loop surrounding the vibration part 110 in the X-Y plane such that the vibration space for the resonator 10 is sealed airtight and maintained under vacuum. The joint part His formed of a metal film obtained by eutectic bonding of, for example, an aluminum (Al) film, a germanium (Ge) film, and an aluminum (Al) film that are stacked on top of each other in the stated order. Alternatively, the joint part H may be formed of a combination of films selected, as appropriate, mainly from a gold (Au) film, a tin (Sn) film, a copper film (Cu), a titanium (Ti) film, and a silicon (Si) film. The joint part H may contain metallic compounds such as titanium nitride (TiN) and tantalum nitride (TaN) to offer enhanced adhesion.

Operation

In the present embodiment, the terminal T1 is grounded, and alternating voltages opposite in phase are applied to the terminals T2 and T3, respectively. The electric field generated in the piezoelectric film F3 in the outer vibration arms 121A and 121D and the electric field generated in the piezoelectric film F3 in inner vibration arms 121B and 121C are thus opposite in phase. Consequently, the vibration of the outer vibration arms 121A and 121D and the vibration of the inner vibration arms 121B and 121C are opposite in phase. When, for example, the mass addition portion 122A of the outer vibration arm 121A and the mass addition portion 122D of the outer vibration arm 121D undergo displacement toward an inner surface of the upper cover 30, the mass addition portion 122B of the inner vibration arm 121B and the mass addition portion 122C of the vibration arm 121C undergo displacement toward the inner surface of the lower cover 20. That is, the vibration arm 121A and the vibration arm 121B, which are adjacent to each other, vibrate vertically in mutually opposite directions about a central axis r1 extending in the Y-axis direction between the vibration arm 121A and the vibration arm 121B. Similarly, the vibration arm 121C and the vibration arm 121D, which are adjacent to each other, vibrate vertically in mutually opposite directions about a central axis r2 extending in the Y-axis direction between the vibration arm 121C and the vibration arm 121D. With the direction of twisting moment on the central axis r1 and the direction of twisting moment on the central axis r2 being opposite to each other, the base section 130 is bent and vibrates. The vibration arms 121A to 121D vibrate in a range of about 100 µm at the maximum and vibrate in a range of about 10 µm under normal driving conditions.

Mass Addition Films 125A to 125D

Figure 6:
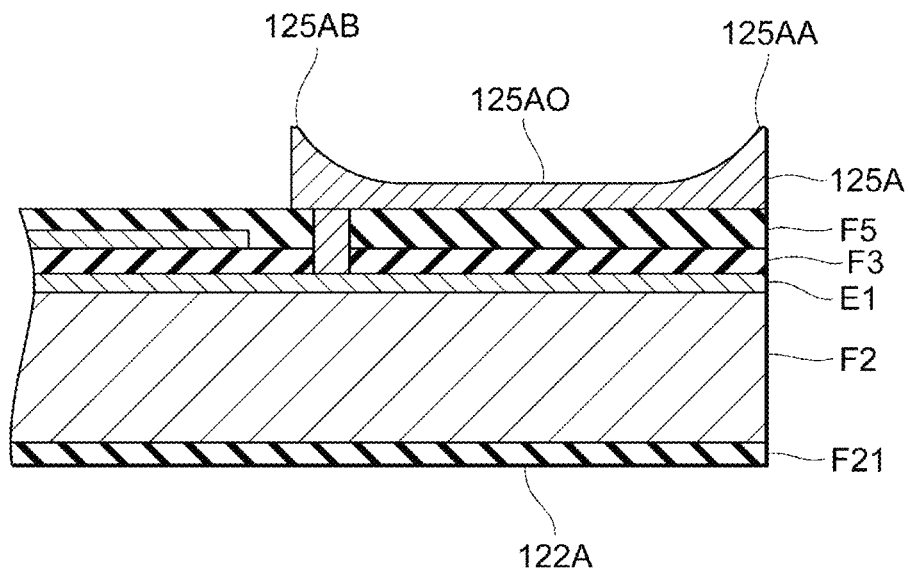
FIG. 6 is a sectional view of a mass addition portion according to the first embodiment, the sectional view being taken along a Y-Z plane.
Figure 7:
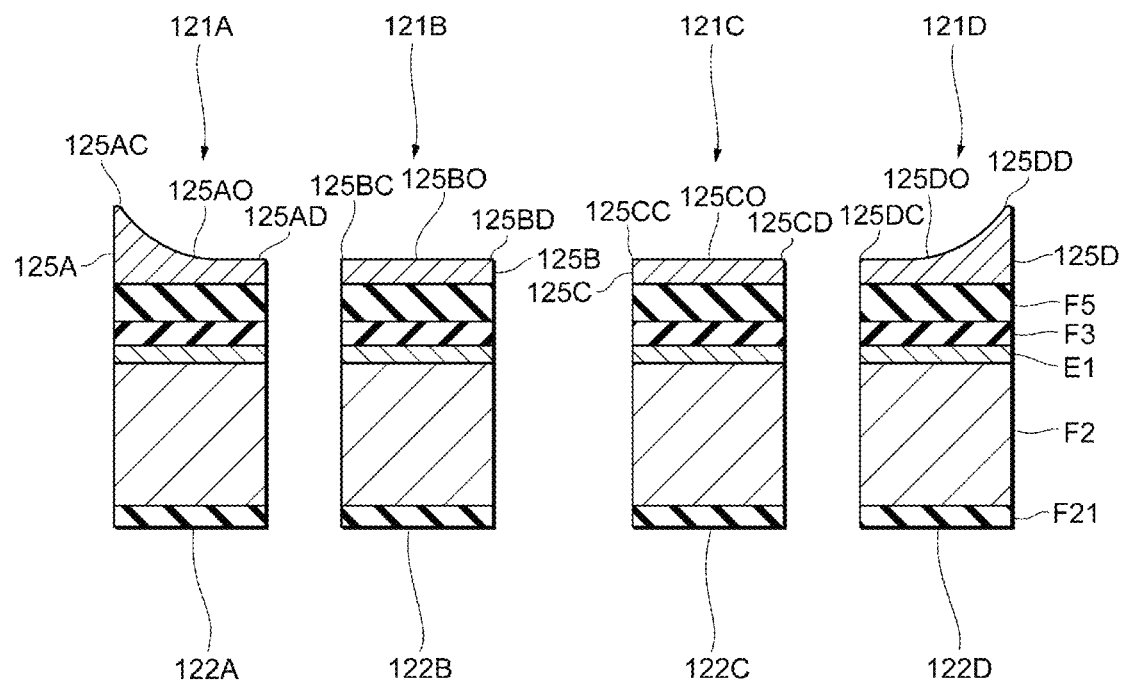
FIG. 7 is a sectional view of the mass addition portion according to the first embodiment, the sectional view being taken along a Z-X plane.
Figure 7:
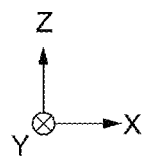

The following describes the shapes of the mass addition films 125A to 125D with reference to FIGS. 6 and 7 according to an exemplary aspect. FIG. 6 is a sectional view of a mass addition portion according to the first embodiment, the sectional view being taken along a Y-Z plane. FIG. 7 is a sectional view of the mass addition portion according to the first embodiment, the sectional view being taken along a Z-X plane. The mass addition films 125A to 125D in their respective sectional views taken along Y-Z planes have the same shape. For this reason, the shape of the mass addition film 125A viewed in section will be described below with reference to FIG. 6, and the mass additional films 125B to 125D viewed in section will neither be illustrated nor described below.

Referring to FIG. 6, the mass addition film 125A includes a film central portion 125AO, a film front end portion 125AA (or simply a front end), and a film rear end portion 125AB (or simply a rear end). The film central portion 125AO is in a central region of the mass addition portion 122A. The film front end portion 125AA and the film rear end portion 125AB are in an end region of the mass addition portion 122A. The film front end portion 125AA is closer than the film central portion 125AO to the open end, and the film rear end portion 125AB is closer than the film central portion 125AO to the fixed end. Moreover, the thickness of the film central portion 125AO in the Z-axis direction (hereinafter simply referred to as the thickness) is smaller than the thickness of each of the film front end portion 125AA and the film rear end portion 125AB. The mass addition film 125A has, on a top surface side thereof, an inclined surface extending from the film central portion 125AO to the film front end portion 125AA and an inclined surface extending from the film central portion 125AO to the film rear end portion 125AB. The inclined surfaces of the mass addition film 125A are formed through trimming processing applied to the mass addition film 125A. The central region and the end region of the mass addition portion 122A except for the mass addition film 125A are substantially equal in thickness to each other. The thickness of the mass addition portion 122A except for the mass addition film 125A herein refers to the sum of the thicknesses of the Si substrate F2, the temperature characteristics correction layer F21, the metal film E1, the piezoelectric film F3, and the protective film F5. When the thickness of the mass addition film 125A is taken into account, the central region of the mass addition portion 122A is thinner than the end region of the mass addition portion 122A.

It is noted that the central region of the mass addition portion 122A herein does not refer to only the exact center of the mass addition portion 122A and refers to a central region including the center (i.e., a region within a predetermined range from the center) of the mass addition portion 122A viewed in plan from the side on which the upper cover 30 is disposed. The end region of the mass addition portion 122A herein does not refer to only an outer edge of the mass addition portion 122A and refers to an outer region including the outer edge (i.e., a region extending from the outer edge with a predetermined width) of the mass addition portion 122A viewed in plan from the side on which the upper cover 30 is disposed. As shown, the central region of the mass addition portion 122A is thinner than the end region of the mass addition portion 122A. Specifically, the thinnest part of the central region of the mass addition portion 122A is thinner than the thickest part of the end region of the mass addition portion 122A. With regard to the example in FIG. 6, the thinnest part of the central region of the mass addition portion 122A is thinner than any other region of the mass addition portion 122A. The same relationship applies to the film central portion 125AO, the film front end portion 125AA, and the film rear end portion 125AB of the mass addition film 125A.

Each of the inclined surfaces of the mass addition film 125A is a curved surface whose inclination increases with increasing distance from the central region of the mass addition portion 122A and with increasing proximity to the end region of the mass addition portion 122A. The inclination of the curved inclined surfaces changes in a continuous manner. That is, the mass addition portion 122A has atop surface that is in the form of a bowl. The inclined surfaces may be formed into the given shape by etching through the use of, for example, a shadow mask during the trimming processing.

Referring to FIG. 7, the mass addition film 125A also includes a film left end portion 125AC and a film right end portion 125AD, which are on the end region of the mass addition portion 122A. The film left end portion 125AC is closer than the film central portion 125AO to the left frame 141C of the holding part 140 (not illustrated), and the film right end portion 125AD is closer than the film central portion 125AO to the right frame 141D of the holding part 140 (not illustrated). Similarly, the mass addition film 125B includes a film left end portion 125BC and a film right end portion 125BD, the mass addition film 125C includes a film left end portion 125CC and a film right end portion 125CD, and the mass addition film 125D includes a film left end portion 125DC and a film right end portion 125DD.

The film central portion 125AO of the mass addition film 125A is thinner than the film left end portion 125AC and is substantially equal in thickness to the film right end portion 125AD. As in the sectional view taken along the Y-Z plane, the mass addition film 125A has an inclined surface, which extends from the film central portion 125AO to the film left end portion 125AC of the mass addition film 125A. The mass addition film 125B includes a film central portion 125BO, whose thickness is substantially equal to the thickness of the film left end portion 125BC and is substantially equal to the thickness of the film right end portion 125BD. The mass addition film 125C includes a film central portion 125CO, whose thickness is substantially equal to the thickness of the film left end portion 125CC and is substantial equal to the thickness of the film right end portion 125CD. The mass addition film 125D includes a film central portion 125DO, whose thickness is substantially equal to the thickness of the film left end portion 125DC and is smaller than the thickness the film right end portion 125DD. As with the mass addition film 125A, the mass addition film 125D has an inclined surface, which extends from the film central portion 125DO to the film right end portion 125DD of the mass addition film 125D.

Specifically, the mass addition film 125A of the outer vibration arm 121A and the mass addition film 125D of the outer vibration arm 121D each have an inclined surface such that their respective outer end portions are thicker (i.e., have a greater height in the Z-axis direction) than their respective inner end portions, with the inclination of the surface changing continuously from the inner end portion to the outer end portion. The mass addition film 125B of the inner vibration arm 121B and the mass addition film 125C of the inner vibration arm 121C each have an outer end portion and an inner portion that are substantially equal in thickness to each other and that are substantially equal in thickness to the inner end portion of the mass addition film 125A of the outer vibration arm 121A and to the thickness of the inner end portion of the mass addition film 125D of the outer vibration arm 121D. The mass addition film 125A of the outer vibration arm 121A and the mass addition film 125D of the outer vibration arm 121D are each heavier than the mass addition film 125B of the inner vibration arm 121B and are each heavier than the mass addition film 125C of the inner vibration arm 121C.

The shapes of the mass addition films 125A to 125D in their respective sectional views taken along Z-X planes are not necessarily as described above. For example, the mass addition films 125A to 125D viewed in section may be substantially identical in shape. Specifically, the mass addition films 125A to 125D may have their respective film central portions that are thinner than their respective film left end portions and that are thinner than their respective film left end portions, and the mass addition films 125A to 125D may each have an inclined surface than is in the form of a bowl.

In the present embodiment, the amount of displacement of the vibration part 110 is greater in regions corresponding to the mass addition portions 122A to 122D than in any other region (e.g., the base section 130 and the arm portions 123A to 123D), and the mass addition portions 122A to 122D have inclined surfaces that slope in such a manner that the mass addition portions 122A to 122D each have end regions and a central region thinner than the end regions. Specifically, the mass addition portions 122A to 122D each have an inclined surface that slopes in such a manner that the mass addition portions 122A to 122D each have end regions and a central region thinner than the end regions in a sectional view taken along a line extending in the direction in which the vibration arms 121A to 121D extend. When external stress is applied, the amount of deformation in the end regions of each of the mass addition portions 122A to 122D is greater than the amount of deformation in the central region of the corresponding one of the mass addition portions 122A to 122D. When the vibration part undergoes a large amount of displacement due to, for example, drop impacts, the end regions of the mass addition portions 122A to 122D will be the first to come into contact with another member and will be significantly deformed. Consequently, the shock will be lessened. This configuration will eliminate or reduce the possibility that the mass addition portions 122A to 122D will become damaged due to, for example, drop impacts. The shock absorbency of the end regions of the mass addition portions 122A to 122D is conducive to taking some of the load that would be applied to the fixed ends (i.e., basal portions) of the vibration arms 121A to 121D when the mass addition portions 122A to 122D come into contact with another member. This will eliminate or reduce the possibility that the basal portions of the vibration arms 121A to 121D will become damaged.

Each of the inclined surfaces of the mass addition portions 122A to 122D is a curved surface whose inclination increases with increasing distance from the central region and with increasing proximity to the end region. This enables a reduction in the impact stress on the surface between the thin central region and the thick end region of each of the mass addition portions 122A to 122D. In case of accidental contact with another member, the end regions of the mass addition portions 122A to 122D will be subjected to external stress; nevertheless, the external stress will be kept from concentrating in a specific site and will be dispersed throughout the mass addition portions 122A to 122D. This makes the mass addition portions 122A to 122D more durable.

Moreover, the inclined surfaces of the mass addition portions 122A to 122D are surfaces of the mass addition films 125A to 125D. The forming of the inclined surfaces of the mass addition films 125A to 125D may be concurrent with the frequency adjustment during the trimming processing. With the mass addition films 125A to 125D being electrically connected to the metal film E1, there is little concern for degradation of vibration characteristics that is due to the coulomb interaction, which would otherwise be caused by electrification of the mass addition films 125A to 125D during the forming of the inclined surfaces by ion beam etching in the trimming processing.

The mass addition films 125A to 125D may each have a film central portion and a film rear end portion thicker than the film central portion. In this case, the inclined surfaces may be formed in such a manner that regions located away from the film rear end portions of the mass addition films 125A to 125D are radiated with ion beams during ion beam etching. This configuration enables a reduction in the amount of ion beam radiation received by the protective film F5, and the electrification of the protective film F5 is inhibited. The variability of the vibration characteristics that is due to the coulomb interaction may be eliminated or reduced accordingly.

The mass addition films 125A to 125D may each have a film central portion and a film front end portion thicker than the film central portion. In this case, the region of each of the mass addition films 125A to 125D that is most likely to come into contact with the upper cover 30 when the vibration arms undergo a large amount of displacement is thicker than any other region of the corresponding one of the mass addition films 125A to 125D. The mass addition films 125A to 125D are thus less prone to damage.

It is noted that it is not always required that the aforementioned shape of the mass addition portions in sectional views each taken along a line extending in the direction in which the vibration arms extend be applicable to all of the vibration arms. For example, at least one of the vibration arms 121A to 121D may include a mass addition portion having an inclined surface that slopes in such a manner that the vibration arm has a central portion and an end portion thicker than the centration portion. In this case, the relevant mass addition portion with the inclined surface formed thereon is less prone to damage.

The mass addition films 125A to 125D may include a film central portion and a film front end portion and a film rear end portion that are thicker than the central portion. In this case, both the film front end portion and the film rear end portion come into contact with the upper cover 30 when the vibration arms undergo a large amount of displacement. The area of contact between the upper cover 30 and each of the mass addition films 125A to 125D is greater than if one of the film front end portion and the film rear end portion of each of the mass addition films 125A to 125D is thicker than the film central portion. In case of accidental contact with the upper cover 30, the mass addition films 125A to 125D can thus cause further dispersion of shock. The mass addition films 125A to 125D are thus less prone to damage.

Upon application of, for example, drop impacts, the base section 130, the vibration arms 121A to 121D, and the holding arm 150 entirely undergo displacement especially when the holding arm 150 includes the holding rear arms 152A and 152B and the holding side arms 153A and 153B. Both the fixed end and the open end of each of the vibration arms 121A to 121D would come close to the upper cover 30, and consequently, the end regions thicker than the central regions of the mass addition portions 122A to 122D would entirely contact the upper cover 30. As the area of the end region thicker than the central region of each of the mass addition portions 122A to 122D is increased, the area of contact between the upper cover 30 and each of the mass addition portions 122A to 122D is increased correspondingly, irrespective of the position of the end region relative to the central region. In case of accidental contact with the upper cover 30, the mass addition portions 122A to 122D can thus cause dispersion of shock.

At least one of the mass addition films 125A to 125D may include a film central portion and a film left end portion thicker than the film central portion and/or a film right end portion thicker than the film central portion. In this case as well, an increase in the area of contact between the upper cover 30 and the relevant mass addition film is achieved. As a result, when there is an accidental contact with the upper cover 30, the relevant mass addition film can disperses the shock of the impact.

A specific configuration examples is as follows. As to the outer vibration arm 121A on the left side, the film left end portion 125AC, which is the outer end portion of the mass addition film 125A, is thicker than each of the film central portion 125AO and the film right end portion 125AD the mass addition film 125A. As to the outer vibration arm 121D on the right side, the film right end portion 125DD, which is the outer end portion of the mass addition film 125D, is thicker than each of the film central portion 125DO and the film left end portion 125DC of the mass addition film 125D. As to the inner vibration arm 121B, the film left end portion 125BC and the film right end portion 125BD of the mass addition film 125B are each substantially equal in thickness to the film central portion 125BO of the mass addition film 125B. As to the inner vibration arm 121C, the film left end portion 125CC and the film right end portion 125CD of the mass addition film 125C are each substantially equal in thickness to the film central portion 125CO of the mass addition film 125C. The mass addition film 125A to 125D are formed into the given shape during the trimming processing in such a manner that the mass addition film 125A to 125D are etched all at once through a mask having an opening facing all of the mass addition film 125A to 125D. In the etching process, the mask having the common opening may be positioned on a target site over the mass addition films 125A to 125D more easily than a mask having individual openings facing the mass addition films 125A to 125D. The yield of resonators may be improved accordingly. At least specific ones of the vibration arms 121A to 121D are formed into the given shape, or more specifically, an increase in the area of contact between the upper cover 30 and each of the mass addition portion 122A of the outer vibration arm 121A and the mass addition portion 122D of the outer vibration arm 121D is achieved. In case of accidental contact with the upper cover 30, the mass addition portions 122A and 122D can disperse shock caused by the impact. The mass addition portion 122B of the inner vibration arm 121B and the mass addition portion 122C of the inner vibration arm 121C are each heavier than the mass addition portion 122A of the outer vibration arm 121A and are each heavier than the mass addition portion 122D of the outer vibration arm 121D, thus yielding an improvement of the drive level dependency (DLD).

The vibration arms 121A to 121D may each include a film central portion and a film left end portion and a film right end portion that are thicker than the film central portion in a sectional view taken along a line extending in a direction crossing the direction in which the vibration arms 121A to 121D extend (i.e., in a sectional view taken along a line extending in the direction in which the vibration arms 121A to 121D are arranged side by side). An increase in the area of contact between the upper cover 30 and each of the mass addition portion 122A of the vibration arm 121A, the mass addition portion 122B of the vibration arm 121B, the mass addition portion 122C of the vibration arm 121C, and the mass addition portion 122D of the vibration arm 121D is achieved. In case of accidental contact with the upper cover 30, the mass addition portions 122A to 122D can thus cause dispersion of shock.

Although according to the exemplary embodiment, the mass addition portions 122A to 122D each have, on a top side thereof, an inclined surface that slopes in such a manner that the central region of the mass addition portion is thinner than at least one of the end regions of the mass addition portion, the resonator 10 is not necessarily in the configuration as described above. For example, the protective film F5 included in the mass addition portions 122A to 122D may have inclined surfaces that slope in such a manner that the mass addition portions 122A to 122D each have end regions and a central region thinner than at least one of the end regions. In this case, the mass addition films 125A to 125D may be omitted or may lie along the inclined surfaces of the protective film F5. Similarly, the Si substrate F2 included in the mass addition portions 122A to 122D may have inclined surfaces that slope in such a manner that the mass addition portions 122A to 122D each have end regions and a central region thinner than at least one of the end regions.

The following describes the configuration of resonators according to additional exemplary embodiments of the present invention. Description of features common to the first embodiment and other embodiments will be omitted, and the following embodiments will be described with regard to only their distinctive features. Specifically, not every embodiment refers to actions and effects caused by similar configurations.

Second Exemplary Embodiment

Figure 8:
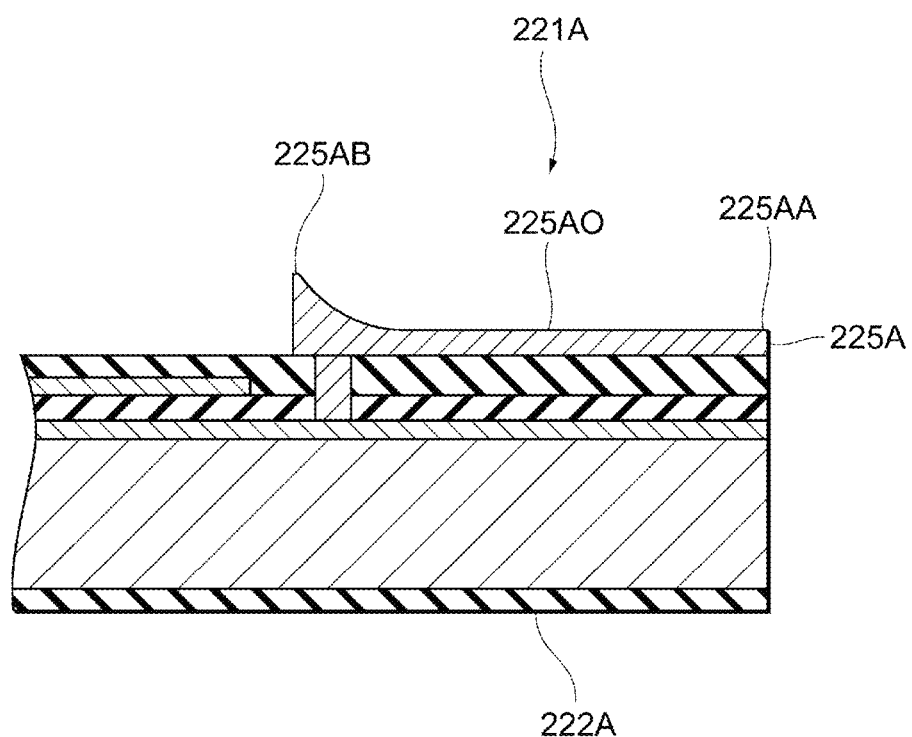
FIG. 8 is a sectional view of a mass addition portion according to a second embodiment, the sectional view being taken along a Y-Z plane.

The following describes a mass addition portion 222A of a vibration arm 221A of a resonator according to a second embodiment with reference to FIG. 8. FIG. 8 is a sectional view of a mass addition portion according to the second embodiment, the sectional view being taken along a Y-Z plane. As with the resonator 10 according to the first embodiment, the resonator according to the second embodiment includes vibration arms each including a mass addition portion. The mass addition portions in sectional views each taken along a line extending in the direction in which the respective vibration arms extend are geometrically identical to the mass addition portion 222A of the vibration arm 221A in FIG. 8. For this reason, the mass addition portions of the vibration arms other than the vibration arm 221A will neither be illustrated nor described below.

The mass addition portion 222A of the vibration arm 221A includes a mass addition film 225A, which includes a film central portion 225AO, a film front end portion 225AA, and a film rear end portion 225AB. As shown the film rear end portion 225AB is thicker than the film central portion 225AO and is thicker than the film front end portion 225AA. As in the first embodiment, this enables a reduction in the amount of ion beam radiation received by another member (e.g., the protective film) included in the vibration arm 221A, and as a result, the electrification of the regions adjacent to the mass addition portion 222A of the vibration arm 221A is inhibited accordingly.

Third Exemplary Embodiment

Figure 9:
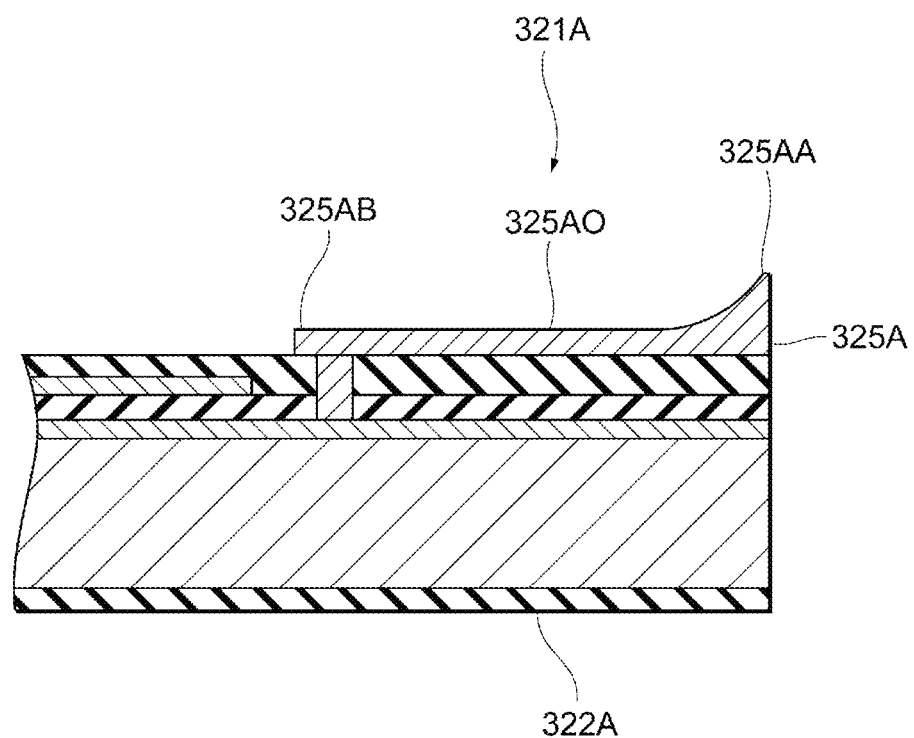
FIG. 9 is a sectional view of a mass addition portion according to a third embodiment, the sectional view being taken along a Y-Z plane.

The following describes a mass addition portion 322A of a vibration arm 321A of a resonator according to a third embodiment with reference to FIG. 9. FIG. 9 is a sectional view of a mass addition portion according to the third embodiment, the sectional view being taken along a Y-Z plane. As in the second embodiment, the mass addition portions of the vibration arms (not illustrated) other than the vibration arm 321A will not be described below with respect to their shapes in sectional views.

The mass addition portion 322A of the vibration arm 321A includes a mass addition film 325A, which includes a film central portion 325AO, a film front end portion 325AA, and a film rear end portion 325AB. The film front end portion 325AA is thicker than the film central portion 325AO and is thicker than the film rear end portion 325AB. As in the first embodiment, the region of the mass addition portion 322A that is most likely to come into contact with the upper cover 30 is thicker than any other region of the mass addition portion 322A, and the mass addition film 325A is thus less prone to damage.

Fourth Exemplary Embodiment

Figure 10:
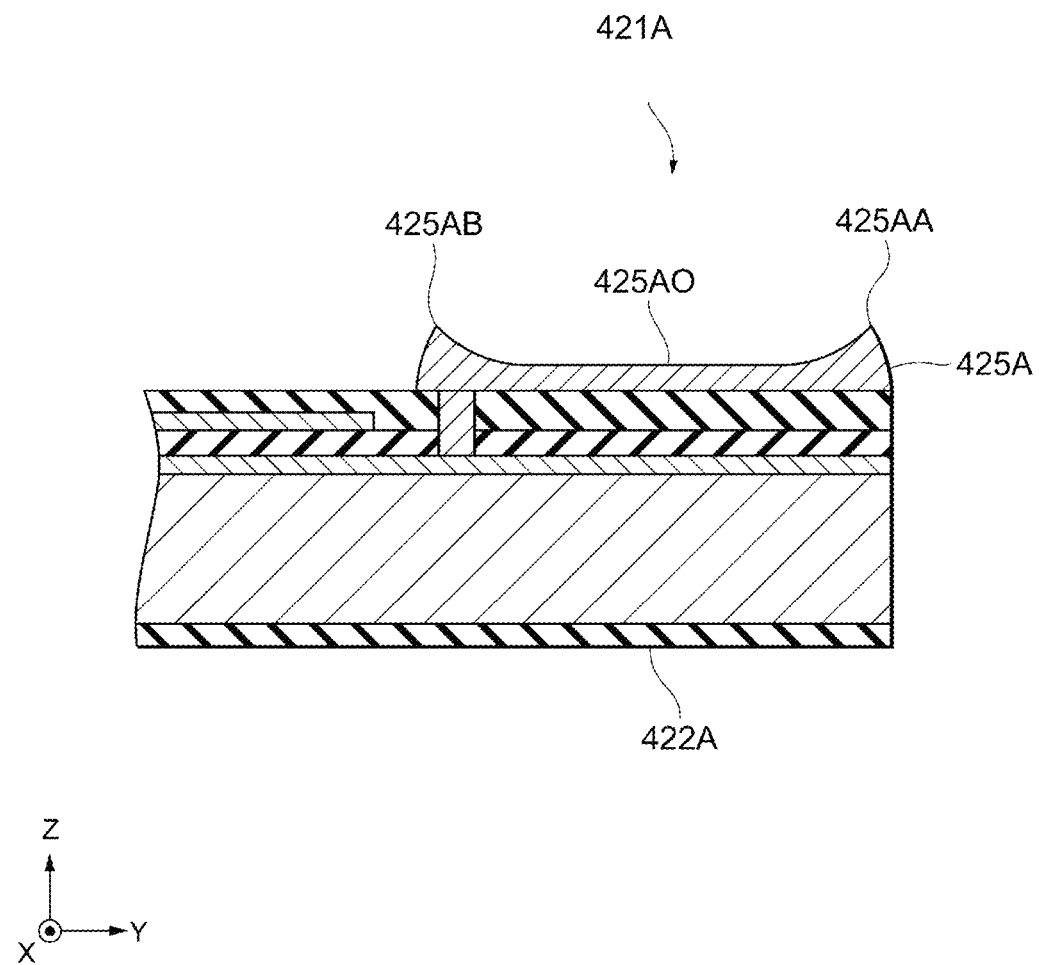
FIG. 10 is a sectional view of a mass addition portion according to a fourth embodiment, the sectional view being taken along a Y-Z plane.

The following describes a mass addition portion 422A of a vibration arm 421A of a resonator according to a fourth embodiment with reference to FIG. 10. FIG. 10 is a sectional view of a mass addition portion according to the fourth embodiment, the sectional view being taken along a Y-Z plane. As in the second embodiment, the mass addition portions of the vibration arms (not illustrated) other than the vibration arm 421A will not be described below with respect to their shapes in sectional views.

The mass addition portion 422A of the vibration arm 421A includes a mass addition film 425A, which includes a film central portion 425AO, a film front end portion 425AA, and a film rear end portion 425AB. In a sectional view taken along a line extending in the direction in which the vibration arm 421A extends, the mass addition film 425A has an inner inclined surface on the film front end portion 425AA and an inner inclined surface on the film rear end portion 425AB. The inner inclined surfaces are contiguous to the film central portion 425AO. The mass addition film 425A also has an outer inclined surface on the film front end portion 425AA and an outer inclined surface on the film rear end portion 425AB. The outer inclined surfaces are curved and located on the respective sides opposite the side on which the film central portion 425AO is located. The outer inclined surfaces are side surfaces each forming a connection between an upper surface and a lower surface of the mass addition film 425A. The mass addition film 425A may be formed into the given shape in the following manner: trimming processing is performed by using a shadow mask such that the upper surface is partially removed to form the inner inclined surfaces, and the upper surface is then entirely subjected to trimming processing in a manner so as to form the outer inclined surfaces. In case of accidental contact with another member, the end regions of the mass addition portions will be subjected to external stress; nevertheless, owing to the inner inclined surfaces and outer inclined surfaces on the film end portions, the external stress will be further kept from concentrating in a specific site and will be further dispersed throughout the mass addition portions.

Fifth Exemplary Embodiment

Figure 11:
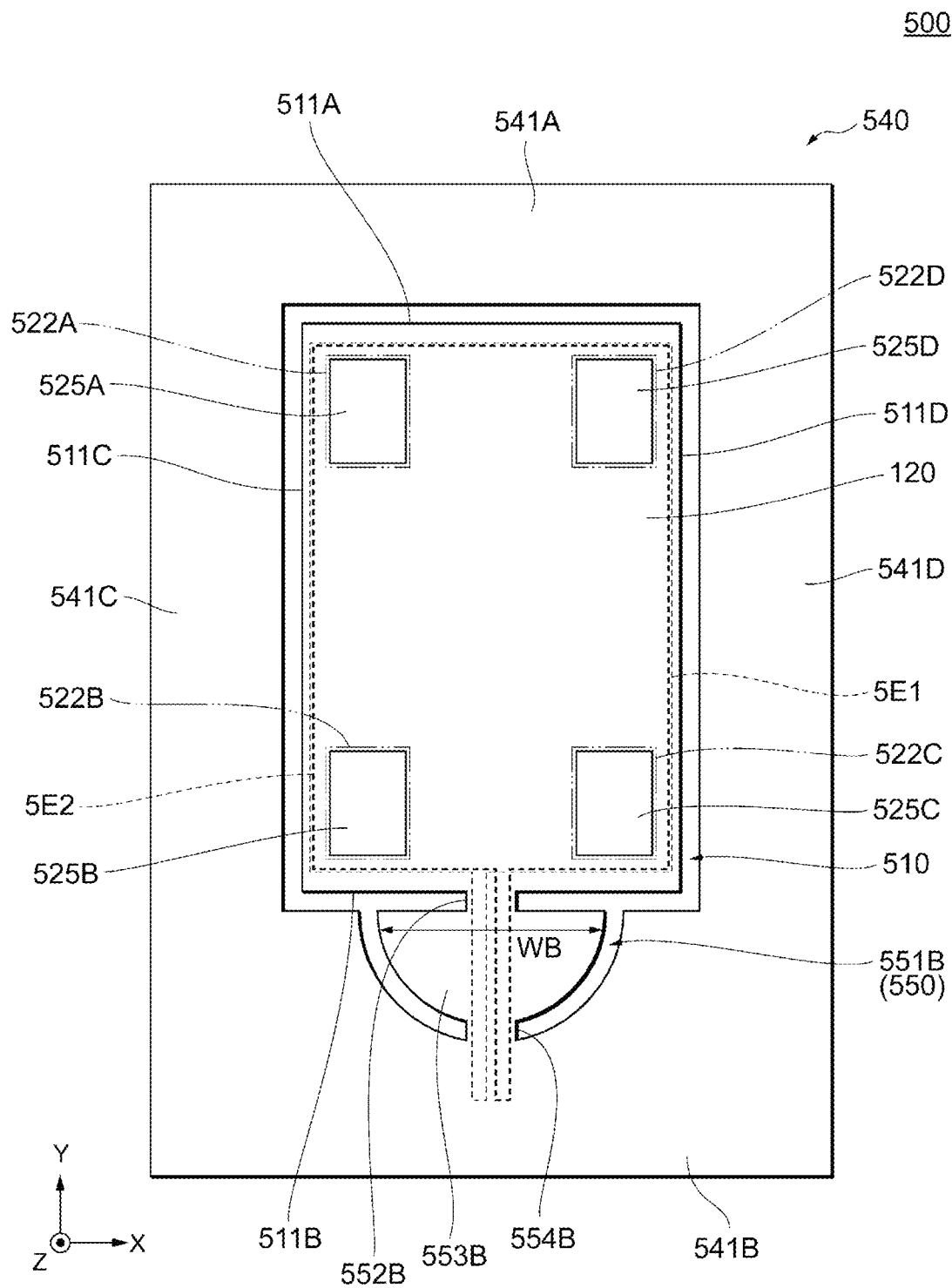
FIG. 11 is a plan view of a resonator according to a fifth embodiment, schematically illustrating the structure of the resonator.
Figure 12:
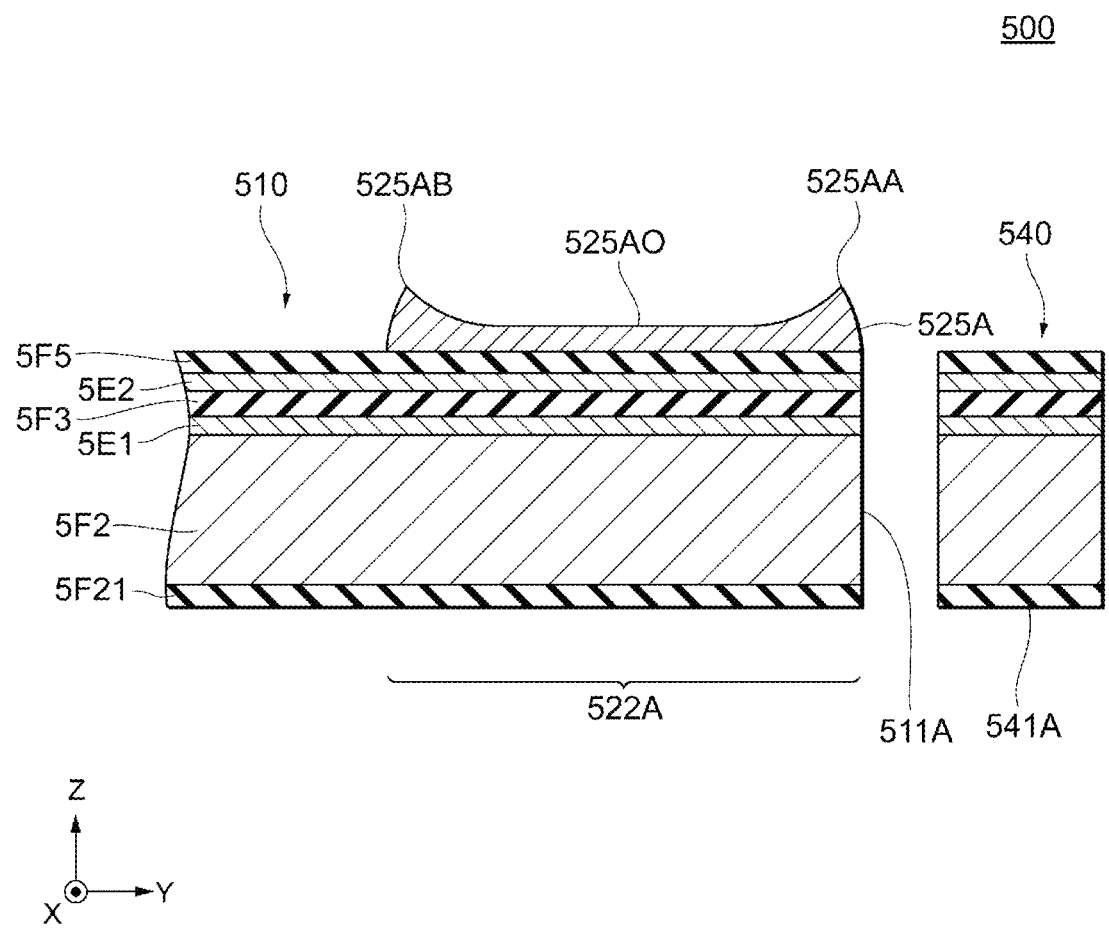
FIG. 12 is a sectional view of a mass addition portion according to the fifth embodiment, the sectional view being taken along a Y-Z plane.

The following describes the configuration of a resonator 500 according to a fifth embodiment with reference to FIGS. 11 and 12. FIG. 11 is a plan view of a resonator according to a fifth embodiment, schematically illustrating the structure of the resonator. FIG. 12 is a sectional view of a mass addition portion according to the fifth embodiment, the sectional view being taken along a Y-Z plane.

As with the resonator 10 according to the first embodiment, the resonator 500 according to the fifth embodiment includes a vibration part, a holding member, and a holding arm, which are denoted by 510, 540, and 550, respectively. As shown, the holding part 540 (i.e., the frame) includes a front frame 541A, a rear frame 541B, a left frame 541C, and a right frame 541D. The resonator 500 includes an Si 5F2, a temperature characteristics correction layer 5F21, a metal film 5E1, a metal film 5E2, a piezoelectric film 5F3, and a protective film 5F5.

The vibration part 510 in an external view is substantially cuboid and is in the form of a flat plate lying in an X-Y plane. When the X-Y plane is viewed in plan as in FIG. 11, the vibration part 510 has a rectangular shape with long sides extending in the Y-axis direction. The piezoelectric film 5F3 and the metal films 5E1 and 5E2 are rectangular and extend substantially allover the vibration part 510. The metal films 5E1 and 5E2 are laid on opposite sides with the piezoelectric film 5F3 therebetween. Upon application of an electric field between the metal film 5E1 and the metal film 5E2, which respectively function as a lower electrode and an upper electrode, the piezoelectric film 5F3 expands and contracts in the X-axis direction and the Y-axis direction. That is, the vibration part 510 vibrates in the expansion-contraction (contour) vibration mode. It is not required that the vibration part 510 be in the form of a flat plate. For example, the vibration part 510 may have the shape of a quadrangular prism having a certain thickness. Referring to FIG. 11, the vibration part 510 has a front side 511A, a rear side 511B, a left side 511C, and a right side 511D. The front side 511A and the rear side 511B, respectively, are adjacent to the front frame 541A and the rear frame 541B and constitute a pair of short sides extending in the X-axis direction. The left side 511C and the right side 511D, respectively, are adjacent to the left frame 541C and the right frame 541D and constitute a pair of long sides extending in the Y-axis direction. Each of the front side 511A, the left side 511C, and the right side 511D is separated from the corresponding one of the front frame 541A, the left frame 541C, and the right frame 541D by a certain release width.

Mass addition portions are placed in four corners and are denoted by 522A to 522D, respectively. The amount of displacement of the vibration part 510 is greater in the four corners than in any other region. When the X-Y plane is viewed in plan, the mass addition portions 522A to 522D are substantially rectangular and each have a pair of long sides and a pair of short sides. The long sides respectively extend along the left side 511C and the right side 511D, and the short sides respectively extend along the front side 511A and the rear side 511B. The mass addition portions 522A to 522D are covered with mass addition films 525A to 525D, each of which is substantially rectangular and extends substantially all over a top surface of the corresponding one of the mass addition portions 522A to 522D. The mass addition film 525A is adjacent to the corner defined by the front side 511A and the left side 511C. The mass addition film 525B is adjacent to the corner defined the rear side 511B and the left side 511C. The mass addition film 525C is adjacent to the corner defined by the rear side 511B and the right side 511D. The mass addition film 525D is adjacent to the corner defined by the front side 511A and the right side 511D.

Referring to FIG. 12, the mass addition film 525A has inclined surfaces that slope in such a manner that a film central portion 525AO is thinner than each of a film front end portion 525AA and a film rear end portion 525AB. The mass addition film 525A may have inclined surfaces that slope in such a manner that the film central portion 525AO is thinner than a film left end portion (not illustrated) and a film right end portion (not illustrated). For example, the mass addition film 525A may have inclined surfaces that slope in such a manner that the film front end portion and the film left end portion that are located away from a central portion of the vibration part 510 are thicker than the film central portion, with the film central portion being equal in thickness to the film rear end portion and the film right end portion that are close to the central portion of the vibration part 510. The mass addition films 525B to 525D may each have inclined surfaces similar to the inclined surfaces of the mass addition film 525A.

The holding arm 550 includes a rear holding arm 551B. The rear holding arm 551B forms a connection between the rear side 511B of the vibration part 510 and the rear frame 541B of the holding part 540. The rear holding arm 551B includes connecting arms, which are denoted by 552B, 553B, and 554B, respectively. The connecting arm 552B forms a connection between the vibration part 510 and the connecting arm 553B, and the connecting arm 554B forms a connection between the connecting arm 553B and the rear frame 541B. The connecting arm 552B is connected to a center of the rear side 511B in the X-axis direction, and the connecting arm 554B is connected to a center of the rear frame 541B in the X-axis direction. The connecting arms 552B and 554B, respectively, are connected to centers of the connecting arm 553B in the X-axis direction. The connecting arms 552B and 554B are substantially equal in width in the X-axis direction. When viewed in plan, the connecting arm 553B is in a semicircular shape whose diameter is greater than the width of each of the connecting arms 552B and 554B in the X-axis direction. The width of the connecting arm 553B in the X-axis direction is denoted by WB and decreases with increasing distance from the connecting arm 552B and with increasing proximity to the connecting arm 554B. In other words, the connecting arm 553B has a straight side wall adjacent to the connecting arm 552B and an arc-shaped side wall adjacent to the connecting arm 554B. The arc-shaped wall of the connecting arm 553B reflects vibration generated in the vibration part 510, thus enhancing the vibration confinement effect.

Sixth Exemplary Embodiment

Figure 13:
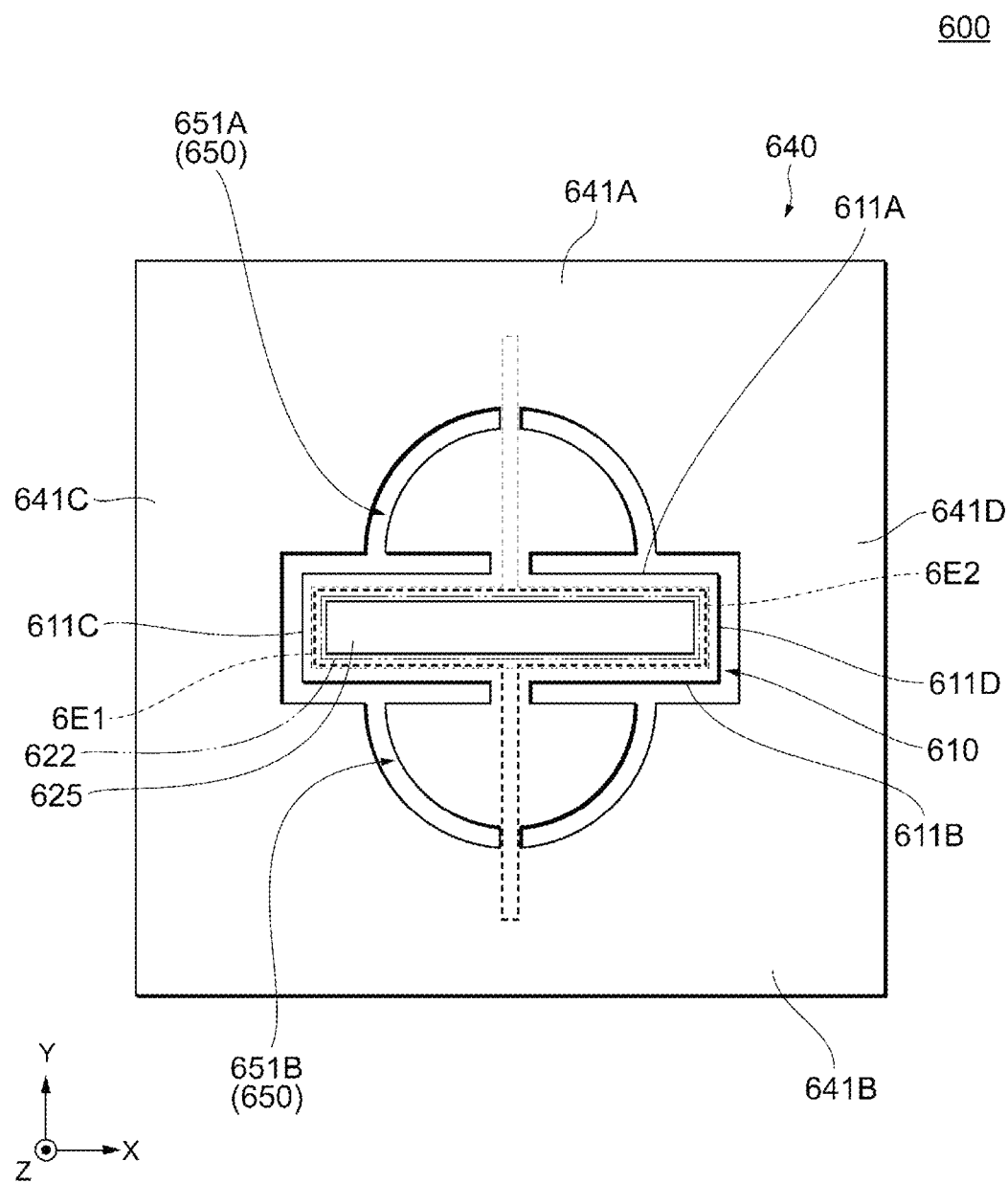
FIG. 13 is a plan view of a resonator according to a sixth embodiment, schematically illustrating the structure of the resonator.

The following describes the configuration of a resonator 600 according to a sixth embodiment with reference to FIGS. 13 and 14. FIG. 13 is a plan view of a resonator according to a sixth embodiment, schematically illustrating the structure of the resonator. FIG. 14 is a sectional view of a mass addition portion according to the sixth embodiment, the sectional view being taken along a Z-X plane.

As with the resonator 500 according to the fifth embodiment, the resonator 600 according to the sixth embodiment includes a vibration part, a holding member, and a holding arm, which are denoted by 610, 640, and 650, respectively. The vibration part 610 has a front side 611A, a rear side 611B, a left side 611C, and a right side 611D and vibrates in the expansion-contraction vibration mode in the X-axis direction and the Y-axis direction. The holding part 640 includes a front frame 641A, a rear frame 641B, a left frame 641C, and a right frame 641D. The vibration part 610 includes an Si substrate 6F2, a temperature characteristics correction layer 6F21, a metal layer 6E1, a metal layer 6E2, a piezoelectric film 6F3, and a protective film 6F5, which are stacked on top of each other.

When the X-Y plane is viewed in plan as in FIG. 13, the vibration part 610 has a rectangular shape with long sides extending in the X-axis direction. The front side 611A and the rear side 611B constitute a pair of long sides extending in the X-axis direction, and the left side 611C and the right side 611D constitute a pair of short sides extending in the Y-axis direction. When the X-Y plane is viewed in plan, the vibration part 610 is covered with a mass addition portion 622, which extends substantially all over a surface of the mass addition portion 622. In other words, the vibration part 610 is covered with a mass addition film 625, which extends substantially all over a surface of the vibration part 610. Referring to FIG. 14, the mass addition film 625 has inclined surfaces that slope in such a manner that a film central portion 625O is thinner than each of a film left end portion 625C and a film right end portion 625D. The mass addition film 625 may have inclined surfaces that slope in such a manner that the film central portion 625O is thinner than a film front end portion (not illustrated) and a film rear end portion (not illustrated).

The mass addition film 625 may have inclined surfaces that slope in such a manner that the film left end portion 625C and the film right end portion 625D are each partially thinned. To give a specific example, the mass addition film 625 may have inclined surfaces that slope in such a manner that regions adjacent to corner portions defined by the sides 611A to 611D are each thicker than regions adjacent to midsections of the sides 611A to 611D and are each thicker than a central portion enclosed within the sides 611A to 611D.

The holding arm 650 includes a front holding arm 651A and a rear holding arm 651B, which are arranged with the vibration part 610 therebetween in the Y-axis direction. The front holding arm 651A forms a connection between the front frame 641A of the holding part 640 and the front side 611A of the vibration part 610, and the rear holding arm 651B forms a connection between the rear frame 641B of the holding part 640 and the rear side 611B of the vibration part 610. The rear holding arm 651B is structurally similar to the rear holding arm 551B in the fifth embodiment, and the front holding arm 651A and the rear holding arm 651B are mirror images of each other with respect to the vibration part 610 disposed therebetween.

Exemplary embodiments of the present invention will be described, in part or in whole, as follows. It is noted that the following should not be construed as limiting the scope of the present invention.

An exemplary aspect of the present invention provides a resonator including a vibration part and a mass addition portion. The vibration part includes a piezoelectric film, an upper electrode, and a lower electrode. The upper and lower electrodes are disposed on opposite sides with the piezoelectric film therebetween. The amount of displacement of the vibration part is greater in a region corresponding to at least part of the mass addition portion than in any other region. The mass addition portion has an inclined surface that slopes in such a manner that the mass addition portion has end regions and a central region thinner than at least one of the end regions when the vibration part is viewed in section.

When external stress is applied, the amount of deformation in the at least one of the end regions of the mass addition portion is greater than the amount of deformation in the central region the mass addition portion. When the vibration part undergoes a large amount of displacement due to, for example, drop impacts, the at least one of the end regions of the mass addition portion will be the first to come into contact with another member and will be significantly deformed. Consequently, the shock will be lessened from the impact of the drop of the device. This will eliminate or reduce the possibility that the mass addition portion will become damaged due to, for example, drop impacts.

According to another exemplary, the resonator also includes a base section. The vibration part includes at least one vibration arm that has a fixed end connected to a front end portion of the base section and an open end located away from the front end portion. The mass addition portion is provided to the open end of the at least one vibration arm. The inclined surface of the mass addition portion slopes in such a manner that the central region is thinner than the at least one of the end regions in a sectional view taken along a line extending in a direction in which the at least one vibration arm extends.

The shock absorbency of the at least one of the end regions of the mass addition portion is conducive to taking some of the load that would be applied to the fixed end (i.e., a basal portion) of the at least one vibration arm when the mass addition portion comes into contact with another member. This will eliminate or reduce the possibility that the basal portion of the at least one vibration arm will become damaged.

In still another aspect, the inclined surface is a curved surface whose inclination increases with increasing distance from the central region and with increasing proximity to the at least one of the end regions.

This configuration eliminates a region of stress concentration, or more specifically, a corner portion on the surface between the thin central region and the thick end region of the mass addition portion. The mass addition portion is thus more durable to resist being damaged by accidental contact with another member.

Still another exemplary aspect is provided in which the at least one vibration arm includes a protective film for insulation. The upper electrode is overlaid with the protective film. The mass addition portion includes a mass addition film on the protective film. The inclined surface is a surface of the mass addition film.

The forming of the inclined surface of the mass addition film may thus be concurrent with frequency adjustment during trimming processing.

In still another aspect, the mass addition film is electrically conductive and is electrically connected to the upper electrode or the lower electrode.

There is little concern for degradation of vibration characteristics that is due to the coulomb interaction, which would otherwise be caused by electrification of the mass addition film during the forming of the inclined surface by ion beam etching in the trimming processing.

Still another exemplary aspect is provided in which the mass addition film includes a film central portion in the central region and a film rear end portion closer than the film central portion to the fixed end. The film rear end portion of the mass addition film is thicker than the film central portion of the mass addition film.

The inclined surface of this configuration may be formed in such a manner that a region located away from the film rear end portion of the mass addition film is radiated with ion beams during ion beam etching. This configuration enables a reduction in the amount of ion beam radiation received by the protective film, and the electrification of the protective film is inhibited. The variability of the vibration characteristics that is due to the coulomb interaction may be eliminated or reduced accordingly.

Still another exemplary aspect is provided in which the mass addition film includes a film central portion in the central region and a film front end portion closer than the film central portion to the open end. The film front end portion of the mass addition film is thicker than the film central portion of the mass addition film.

The region of the mass addition film that is most likely to come into contact with another member when the at least one vibration arm undergoes a large amount of displacement is thicker than any other region of the mass addition film. The mass addition film is thus less prone to damage.

Still another exemplary aspect is provided in which the resonator also includes a holding part and a holding arm. The holding part holds the base section and the at least one vibration arm. The holding arm forms a connection between the base section and the holding part. The holding arm includes a holding rear arm and a holding side arm. The holding rear arm is connected to a rear end portion opposite the front end portion of the base section. The holding side arm is connected to the holding rear arm and extends along the at least one vibration arm in a manner so as to lie between the base section and the holding part.

Upon application of, for example, drop impacts, the base section and the at least one vibration arm entirely undergo displacement. Both the fixed end and the open end of the at least one vibration arm would come close to another member, and consequently, the end region thicker than the central region of the mass addition portion would entirely come into contact with the relevant member. As the area of the end region thicker than the central region of the mass addition portion is increased, the area of contact between the mass addition portion and the relevant member is increased correspondingly, irrespective of the position of the end region relative to the central region. In case of accidental contact with the relevant member, the mass addition portion can thus cause dispersion of shock.

Still another exemplary aspect provides a resonance device including the resonator, a lower cover, and an upper cover. The lower cover is joined to the resonator. The upper cover is joined to the lower cover with the resonator therebetween. A vibration space in which the at least one vibration arm vibrates is defined between the upper cover and the lower cover.

In general, the embodiments above have been described to facilitate the understanding of the present invention and should not be construed as limiting the scope of the present invention. The present invention may be altered and/or improved without departing from the spirit of the present invention and embraces equivalents thereof. That is, the embodiments with design changes made as appropriate by those skilled in the art fall within the scope of the present invention as long as the features of the present invention are involved. For example, constituent components in the embodiments above and the arrangement, materials, conditions, shapes, and sizes of the constituent components are not limited to those mentioned in the description and may be changed as appropriate. Resonators that operate in modes other than the bending-vibration mode and the expansion-contraction vibration mode may include such a mass addition portion. Effects similar to those of the aforementioned resonator may be produced when the amount of displacement of the vibration part is greater in a region corresponding to at least part of the mass addition portion than in any other region and when the mass addition portion has an inclined surface that slopes in such a manner that the mass addition portion has end regions and a central region thinner than at least one of the end regions. Varying combinations of the components of the embodiments may be devised as long as they are technically possible, and these combinations also fall within the scope of the present invention as long as the features of the present invention are involved.

REFERENCE SIGNS LIST 1 resonance device
10 resonator
20 lower cover
30 upper cover
21, 31 recess
22, 32 bottom plate
23, 33 side wall
110 vibration part
121A to 121D vibration arm
122A to 122D mass addition portion
123A to 123D arm portion
125A to 125D mass addition film
125AO film central portion
125AA film front end portion
125AB film rear end portion 125AC film left end portion
125AD film right end portion
130 base section
131A front end portion
131B rear end portion
131C left end portion
131D right end portion
140 holding part
141A front frame
141B rear frame
141C left frame
141D right frame
150 holding arm
151A left holding arm
151B right holding arm
152A, 152B holding rear arm
153A, 153B holding side arm
F2 Si substrate
F21 temperature characteristics correction layer
F3 piezoelectric film
F5 protective film
E1 metal film (lower electrode)
E2 metal film (upper electrode)

The invention claimed is:

1. A resonator comprising:
a vibrator that includes an upper electrode, a lower electrode, a via electrode, and a piezoelectric film disposed therebetween, the via electrode connected to one of the upper electrode and the lower electrode; and
a mass addition member constructed to have an amount of displacement that is greater than in other regions of the vibrator,
wherein the mass addition member has an inclined surface that slopes, such that the mass addition member has end regions and a central region, the central region being thinner than at least one of the end regions when the vibrator is viewed in a plan view thereof, and
wherein the at least one end region of the mass addition member that is thicker than the central region is on the via electrode.

2. The resonator according to claim 1, further comprising:
a base; and
at least one vibration arm that has a fixed end connected to a front end of the base and an open end disposed away from the front end,
wherein the mass addition member is disposed on the open end of the at least one vibration arm.

3. The resonator according to claim 2, wherein the inclined surface of the mass addition member slopes in such a manner that the central region is thinner than the at least one end region in a sectional view taken along a line extending in a direction in which the at least one vibration arm extends.

4. The resonator according to claim 3, wherein the inclined surface is a curved surface with an inclination that increases with increasing distance from the central region towards the at least one end region.

5. The resonator according to claim 3, wherein the at least one vibration arm includes a protective film with the upper electrode being overlaid with the protective film, and the mass addition member includes a mass addition film on the protective film.

6. The resonator according to claim 5, wherein the inclined surface is a surface of the mass addition film.

7. The resonator according to claim 6, wherein the mass addition film is electrically conductive and is electrically connected to one of the upper electrode or the lower electrode by the via electrode.

8. The resonator according to claim 6, wherein the mass addition film includes a film central portion in the central region and a film rear end portion closer than the film central portion to the fixed end, with the film rear end portion being thicker than the film central portion of the mass addition film.

9. The resonator according to claim 6, wherein the mass addition film includes a film central portion in the central region and a film front end portion closer than the film central portion to the open end, with the film front end portion being thicker than the film central portion of the mass addition film.

10. The resonator according to claim 3, further comprising:
a frame that holds the base and the at least one vibration arm; and
a holding arm that connects the base to the frame.

11. The resonator according to claim 10, wherein the holding arm includes a holding rear arm connected to a rear end opposite the front end of the base, and a holding side arm connected to the holding rear arm and extending along the at least one vibration arm in a configuration to lie between the base and the frame.

12. A resonance device comprising:
the resonator according to claim 1;
a lower cover joined to the resonator; and
an upper cover joined to the lower cover with the resonator disposed in a vibration space defined between the upper cover and the lower cover.

13. A resonator comprising:
a base; and
at least one vibration arm that extends from the base and includes an upper electrode, a lower electrode, a via electrode connected to one of the upper electrode and the lower electrode, and a piezoelectric film disposed therebetween;
a mass addition member disposed on open end of the at least one vibration arm that is opposite the base and has an inclined surface in a plan view thereof, such that the mass addition member has end regions and a central region therebetween, the central region being thinner than at least one of the end regions relative to the plan view thereof, and
wherein the at least one end region of the mass addition member that is thicker than the central region is on the via electrode.

14. The resonator according to claim 13, wherein the mass addition member is constructed to have an amount of displacement that is greater than a displacement in other regions of the at least one vibration arm.

15. The resonator according to claim 13, wherein the inclined surface of the mass addition member slopes in such a manner that the central region is thinner than the at least one end region in a sectional view taken along a line extending in a direction in which the at least one vibration arm extends.

16. The resonator according to claim 15, wherein the inclined surface is a curved surface with an inclination that increases with increasing distance from the central region towards the at least one end region.

17. The resonator according to claim 15, wherein the at least one vibration arm includes a protective film with the upper electrode being overlaid with the protective film, and the mass addition member includes a mass addition film on the protective film.

18. The resonator according to claim 17, wherein the inclined surface is a surface of the mass addition film.

19. The resonator according to claim 18, wherein the mass addition film includes a film central portion in the central region and a film rear end portion closer than the film central portion to a fixed end, with the film rear end portion being thicker than the film central portion of the mass addition film in the plan view thereof.

20. The resonator according to claim 18, wherein the mass addition film includes a film central portion in the central region and a film front end portion closer than the film central portion to the open end, with the film front end portion being thicker than the film central portion of the mass addition film in the plan view thereof.

* * * * *